(12) United States Patent
Xie et al.

(10) Patent No.: US 12,336,294 B2
(45) Date of Patent: Jun. 17, 2025

(54) GATE-CUT AND SEPARATION TECHNIQUES FOR ENABLING INDEPENDENT GATE CONTROL OF STACKED TRANSISTORS

(71) Applicant: International Business Machines Corporation, Armonk, NY (US)

(72) Inventors: Ruilong Xie, Niskayuna, NY (US); Nicolas Loubet, Guilderland, NY (US); Julien Frougier, Albany, NY (US); Lawrence A. Clevenger, Saratoga Springs, NY (US); Prasad Bhosale, Albany, NY (US); Junli Wang, Slingerlands, NY (US); Balasubramanian Pranatharthiharan, Santa Clara, CA (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 707 days.

(21) Appl. No.: 17/522,974

(22) Filed: Nov. 10, 2021

(65) Prior Publication Data
US 2023/0142226 A1    May 11, 2023

(51) Int. Cl.
*H10D 88/00* (2025.01)
*H10D 30/67* (2025.01)
*H10D 84/03* (2025.01)
*H10D 84/85* (2025.01)

(52) U.S. Cl.
CPC ......... *H10D 88/00* (2025.01); *H10D 30/6735* (2025.01); *H10D 84/038* (2025.01); *H10D 84/85* (2025.01); *H10D 88/01* (2025.01)

(58) Field of Classification Search
None
See application file for complete search history.

(56) References Cited

U.S. PATENT DOCUMENTS

| | | | |
|---|---|---|---|
| 9,685,436 B2 | 6/2017 | Morrow et al. | |
| 10,084,053 B1 | 9/2018 | Xie et al. | |
| 10,192,819 B1 | 1/2019 | Chanemougame et al. | |
| 10,192,867 B1 | 1/2019 | Frougier et al. | |
| 10,388,519 B2 | 8/2019 | Smith et al. | |
| 10,510,622 B1 | 12/2019 | Frougier et al. | |

(Continued)

OTHER PUBLICATIONS

Chehab, "Design-technology co-optimization of sequential and monolithic CFET as enabler of technology node beyond 2nm", Proceedings vol. 11614, Design-Process-Technology Co-optimization XV, Apr. 22, 2021; 5p.

(Continued)

*Primary Examiner* — Nilufa Rahim
(74) *Attorney, Agent, or Firm* — CANTOR COLBURN LLP; L. Jeffrey Kelly

(57) ABSTRACT

Embodiments of the invention include vertically stacked field-effect transistors (FETs). The vertically stacked FETs include at least one first transistor and at least one second transistor separated by a dielectric isolation layer. Gate material is adjacent to the at least one first transistor and the at least one second transistor, at least one first height vertical layer being adjacent to and about a height of the gate material, at least one second height vertical layer being adjacent to and less than the height of the gate material.

6 Claims, 36 Drawing Sheets

(56) References Cited

U.S. PATENT DOCUMENTS

| | | |
|---|---|---|
| 10,811,415 B2 | 10/2020 | Sengupta et al. |
| 10,937,786 B2 | 3/2021 | Zang et al. |
| 2018/0040695 A1 | 2/2018 | Smith et al. |
| 2019/0172828 A1* | 6/2019 | Smith .................... H10D 86/60 |
| 2019/0355756 A1 | 11/2019 | Nelson et al. |
| 2019/0393214 A1* | 12/2019 | Lilak ...................... H10D 88/00 |
| 2020/0381430 A1 | 12/2020 | Liebmann et al. |
| 2022/0367520 A1* | 11/2022 | Hong ..................... H10D 88/01 |

OTHER PUBLICATIONS

International Search Report; International Application No. PCT EP2022/080746; International Filing Date: Nov. 3, 2022; Date of mailing: Feb. 6, 2023; 15 pages.

Ryckaert et al., "The Complementary FET (CFET) for CMOS scaling beyond N3," Symposium on VLSI Technology Digest of Technical Papers, 2018, pp. 141-142. 2 pages.

\* cited by examiner

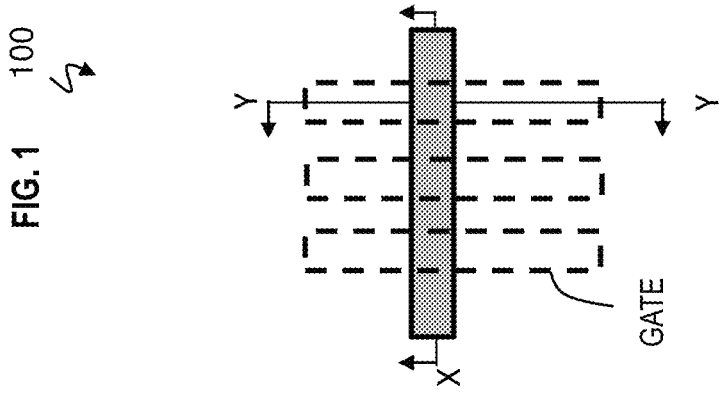

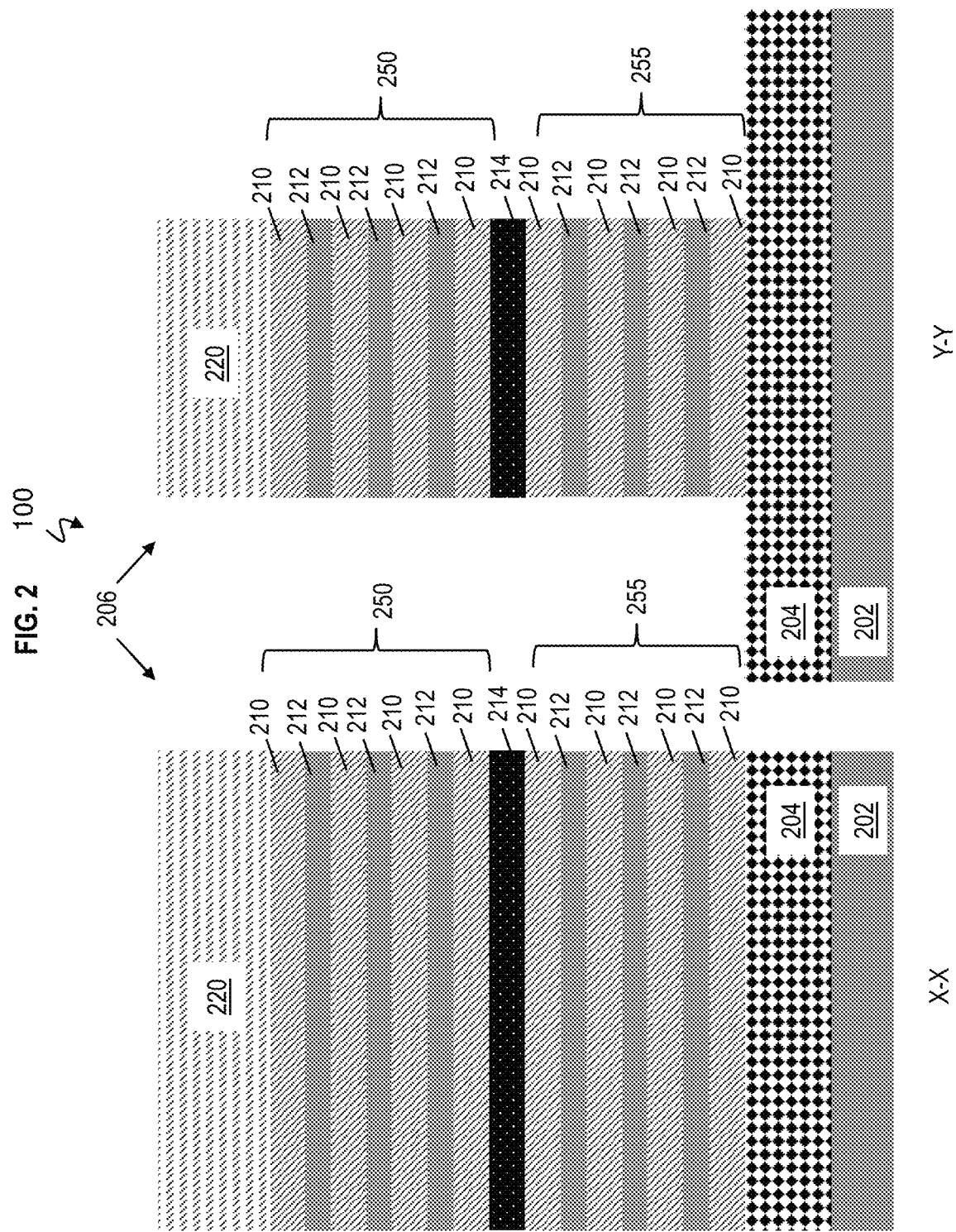

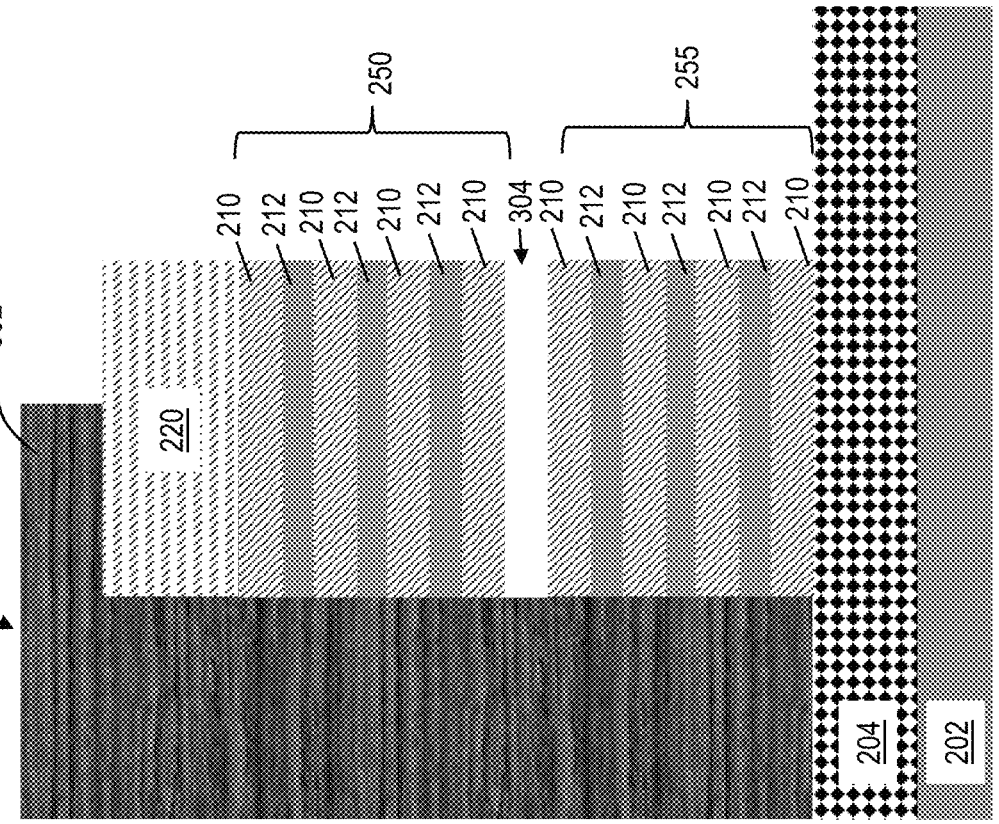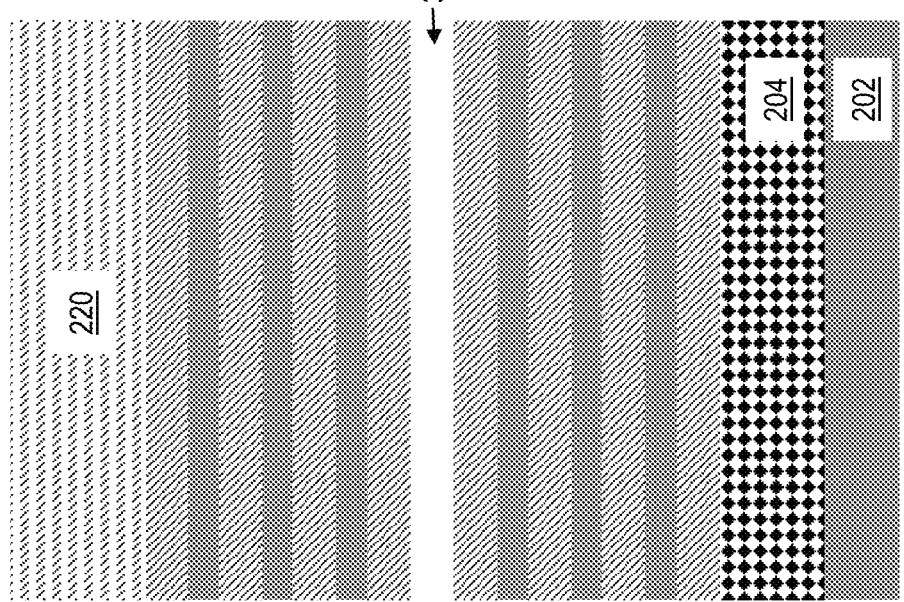

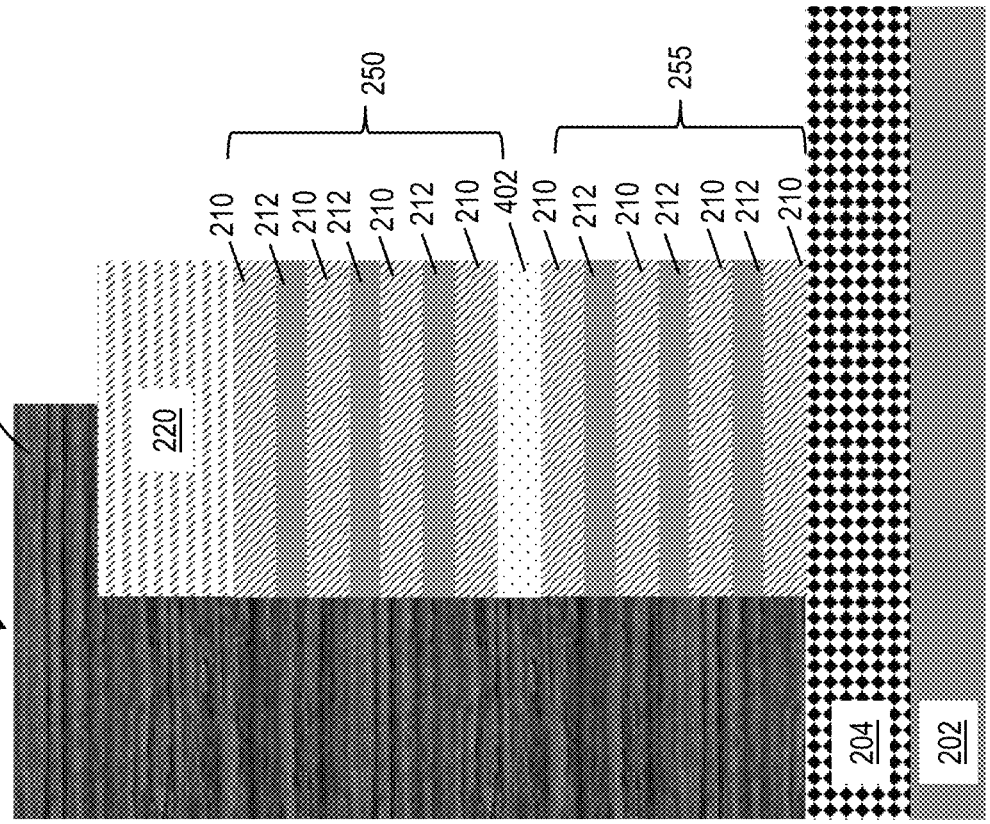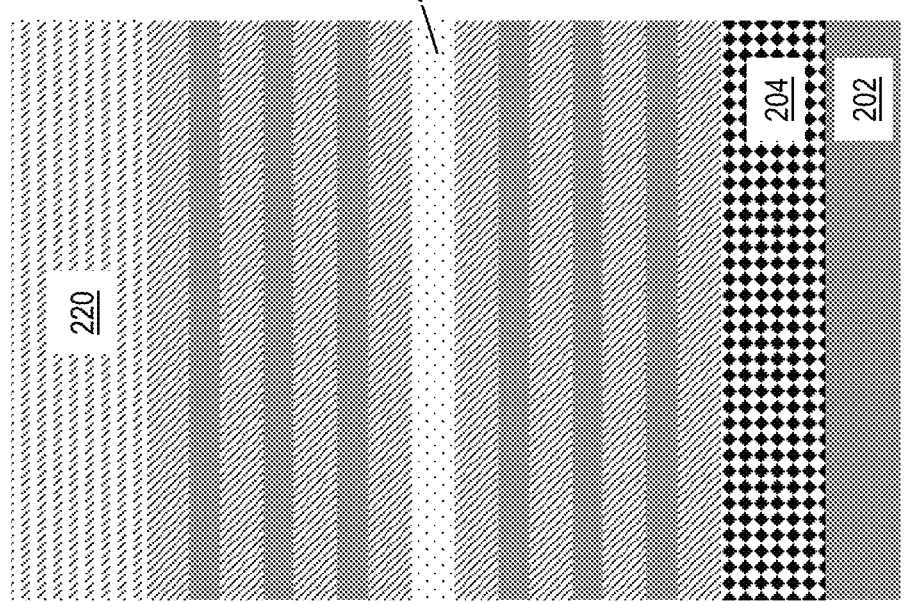
FIG. 4

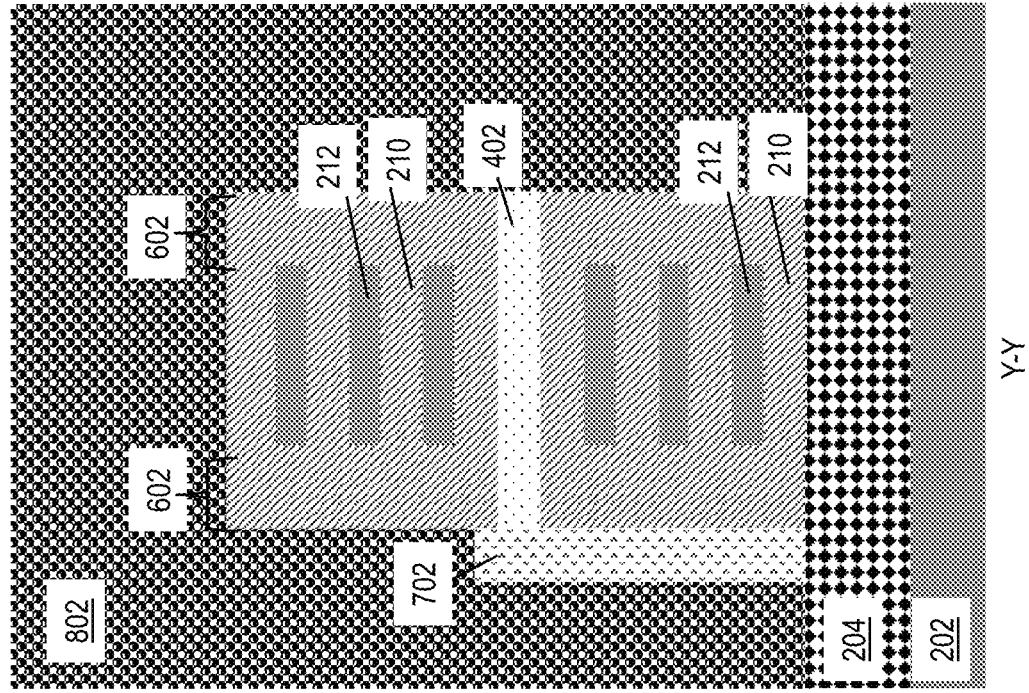
FIG. 9
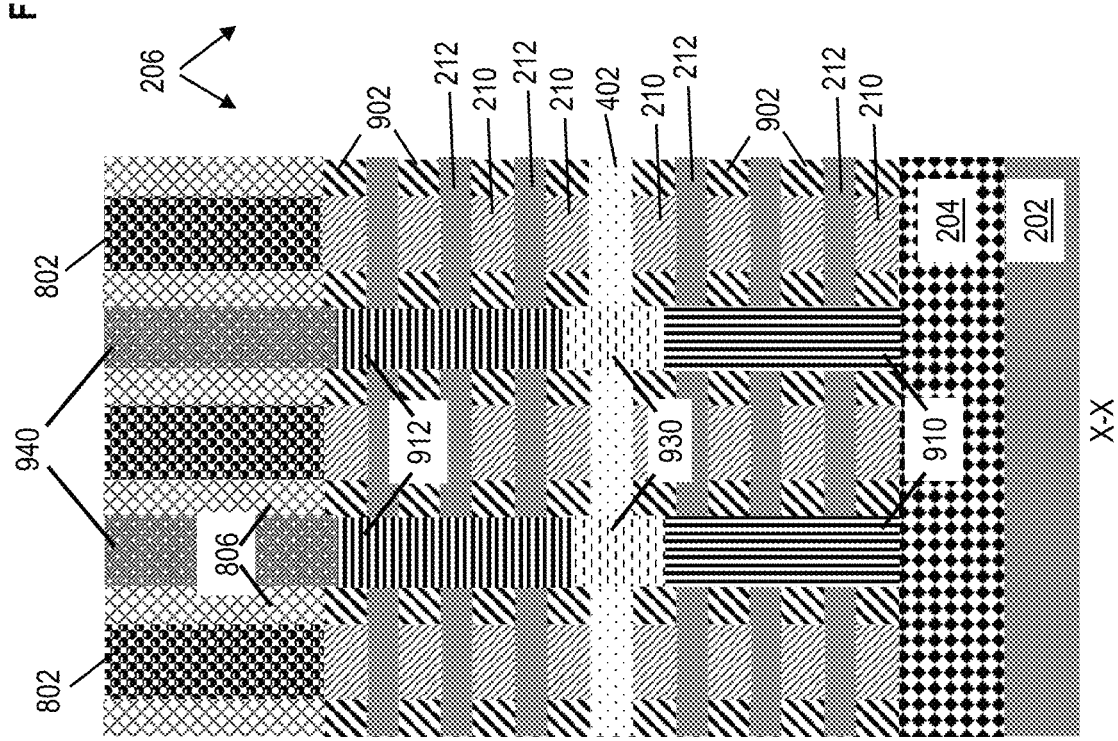

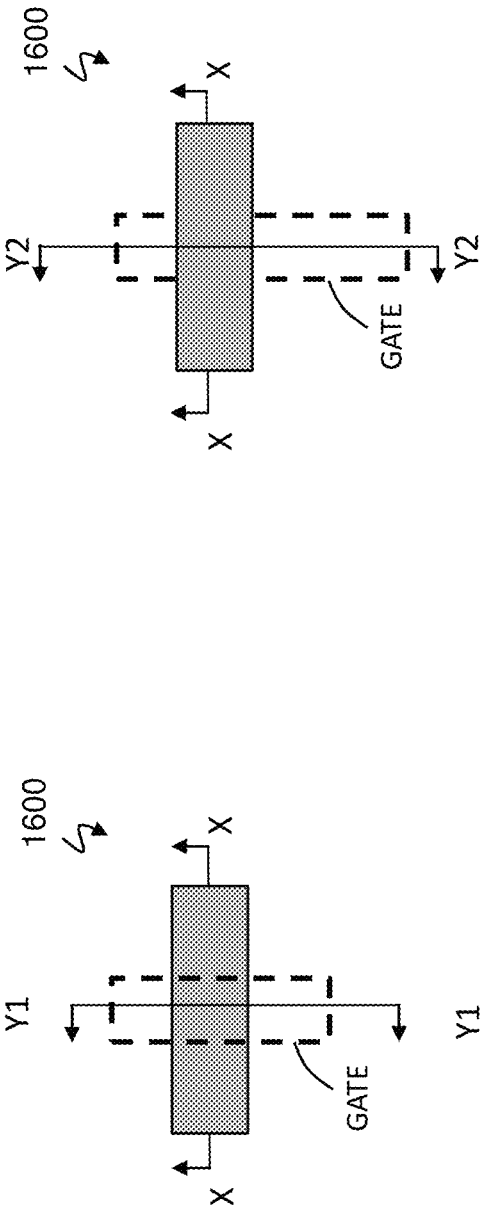

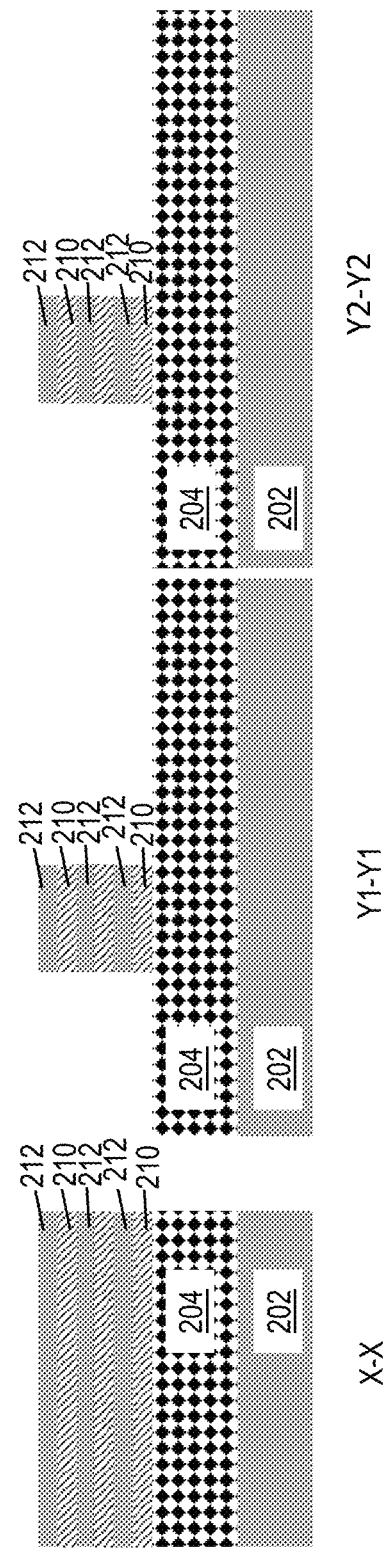

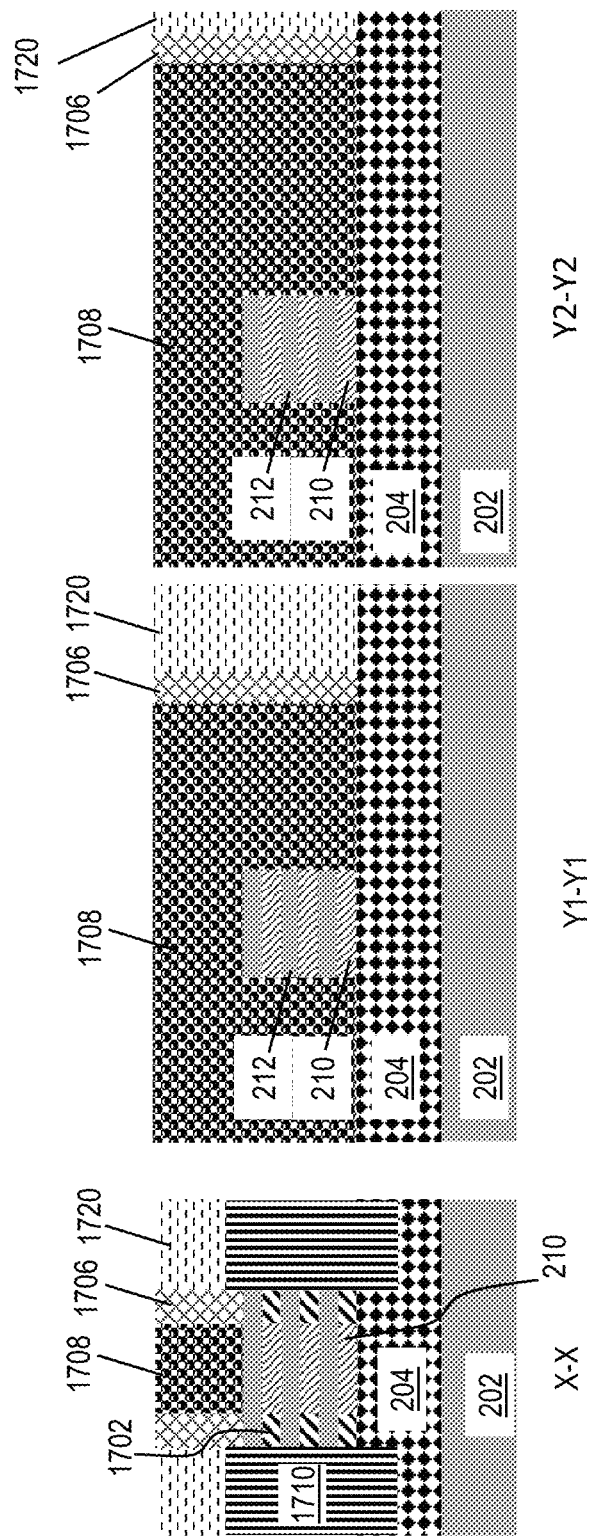

FIG. 30
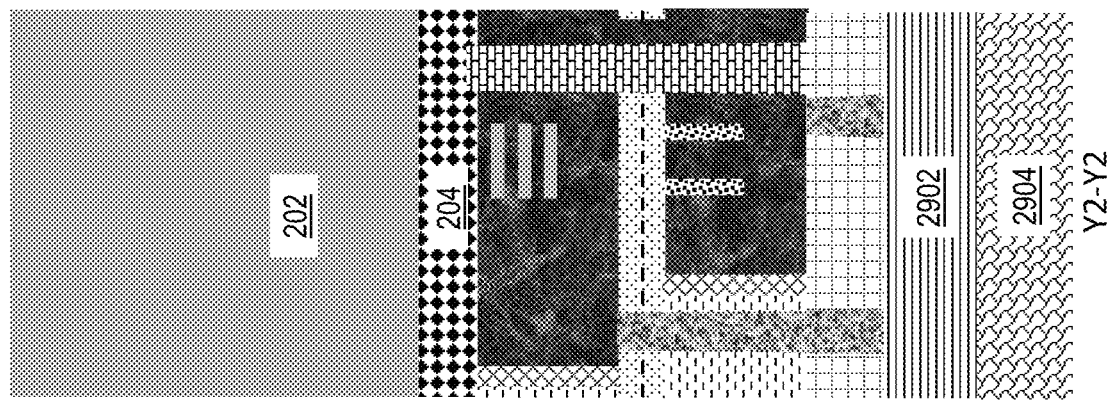
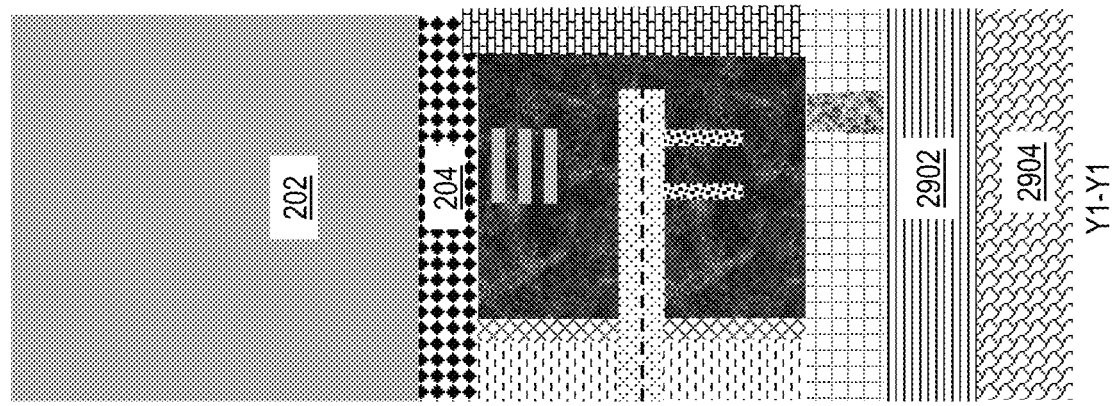
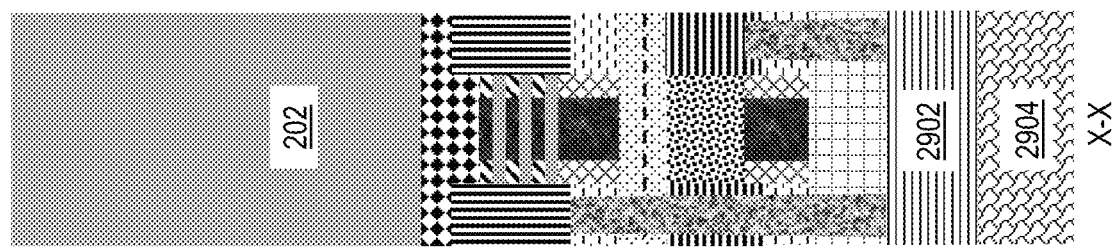

FIG. 33
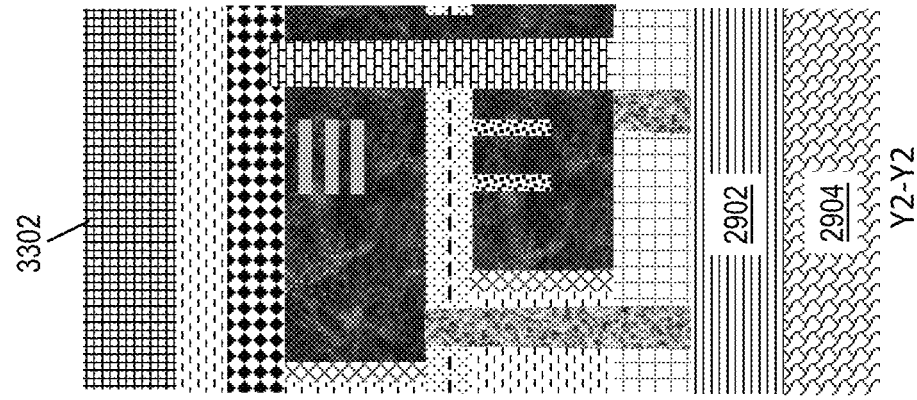
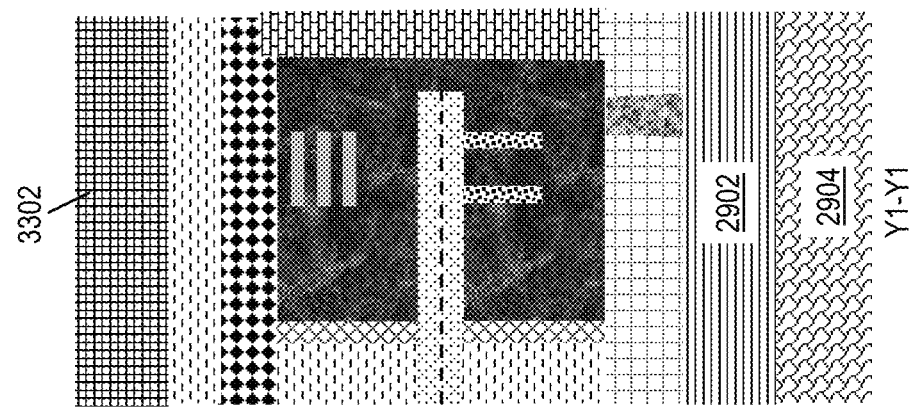
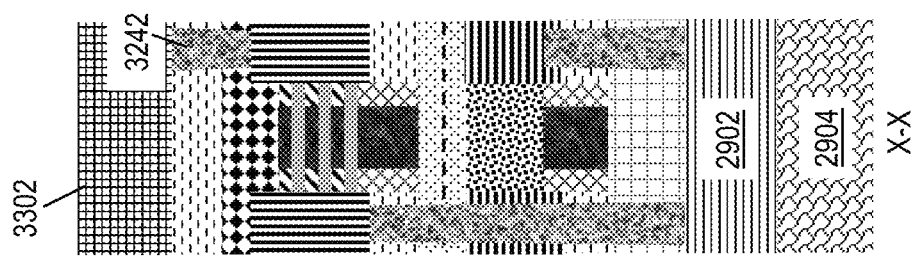

GATE-CUT AND SEPARATION TECHNIQUES FOR ENABLING INDEPENDENT GATE CONTROL OF STACKED TRANSISTORS

BACKGROUND

The present invention generally relates to fabrication methods and resulting structures for integrated circuits, and more specifically, to fabrication methods and resulting structures configured and arranged to implement gate-cut and separation techniques for enabling independent gate control of stacked field-effect transistor (FET) technology.

A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D)) devices, such as a FinFET device, which is a three-dimensional structure. One type of device that shows promise for advanced integrated circuit products of the future is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

One example of a complex gate-all-around technology is a complementary-FET, which is a 3D monolithic structure having N-type FET (NFET) and P-type FET (PFET) nanowires/nanosheets vertically stacked on top of each other. A complementary-FET layout typically has P-type FETs on one level and N-type FETs on an adjacent level (i.e., above or below). In such structures, the source/drain regions of the lower FET are electrically isolated from the source/drain regions of the upper FET by dielectric layers.

SUMMARY

Embodiments of the present invention are directed to devices implemented using gate cut and separation techniques for stacked FET technology. A non-limiting device includes vertically stacked transistors including at least one first transistor and at least one second transistor separated by a dielectric isolation layer. The device includes gate material adjacent to the at least one first transistor and the at least one second transistor. At least one first height vertical layer is adjacent to and about a height of the gate material. At least one second height vertical layer is adjacent to and less than the height of the gate material.

Embodiments of the present invention are directed to a device that includes an independent gate device having first vertically stacked transistors and a first center dielectric layer connecting one first vertical layer to another first vertical layer, wherein the first center dielectric layer separates first transistors in the first vertically stacked transistors. The device includes a shared gate device including second vertically stacked transistors and a second center dielectric layer separating second transistors of the second vertically stacked transistors.

Embodiments of the present invention are directed to a device that includes an independent gate device including first vertically stacked transistors and a first center dielectric layer connected to a first vertical layer. The device further includes a shared gate device having second vertically stacked transistors and a second center dielectric layer, wherein the shared gate material is present at a space between the second center dielectric layer and a second vertical layer.

Other embodiments of the present invention implement features of the above-described devices/structures in methods.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a top view of a simplified illustration of a portion of an integrated circuit (IC) having a stacked FET device according to embodiments of the invention;

FIG. 2 depicts a cross-sectional view of a portion of an IC under-fabrication after fabrication operations according to one or more embodiments of the invention;

FIG. 3 depicts a cross-sectional view of a portion of an IC under-fabrication after fabrication operations according to one or more embodiments of the invention;

FIG. 4 depicts a cross-sectional view of a portion of an IC under-fabrication after fabrication operations according to one or more embodiments of the invention;

FIG. 9 depicts a cross-sectional view of a portion of an IC under-fabrication after fabrication operations according to one or more embodiments of the invention;

FIG. 16A depicts a top view of a simplified illustration of a portion of an IC having a stacked FET device according to embodiments of the invention;

FIG. 16B depicts a top view of a simplified illustration of a portion of an IC having a stacked FET device according to embodiments of the invention;

FIG. 17 depicts a cross-sectional view of a portion of an IC under-fabrication after fabrication operations according to one or more embodiments of the invention;

FIG. 18 depicts a cross-sectional view of a portion of an IC under-fabrication after fabrication operations according to one or more embodiments of the invention;

FIG. 30 depicts a cross-sectional view of a portion of an IC under-fabrication after fabrication operations according to one or more embodiments of the invention;

FIG. 33 depicts a cross-sectional view of a portion of an IC under-fabrication after fabrication operations according to one or more embodiments of the invention;

DETAILED DESCRIPTION

Figure 5:
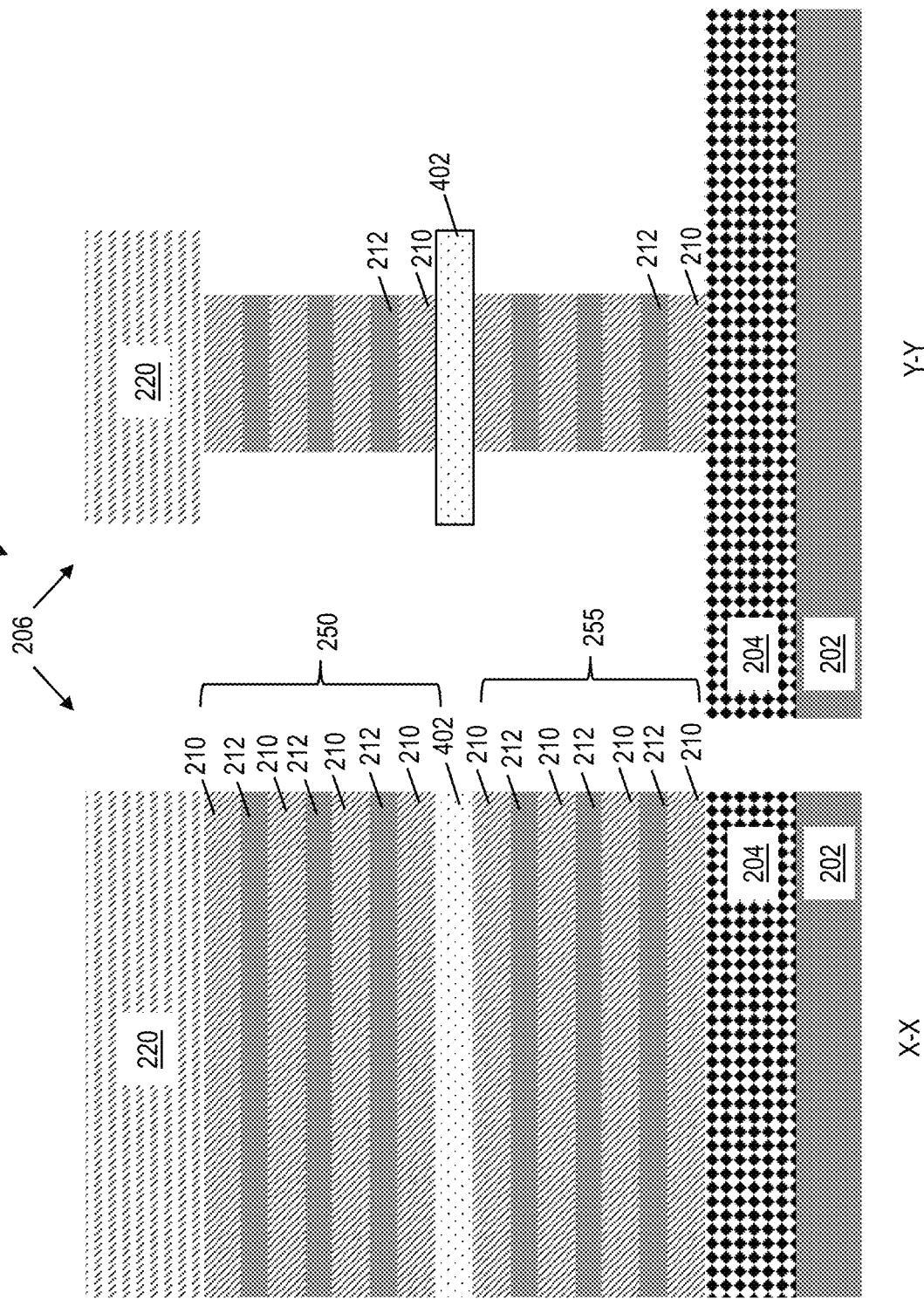
FIG. 5 depicts a cross-sectional view of a portion of an IC under-fabrication after fabrication operations according to one or more embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

A complementary-FET device is a complex structure. One or more embodiments of the invention describe methods and subsequent device/structures which use a gate cut and separation technique for stacked FET technology. One or more embodiments of the invention describe a (simultaneous) replacement gate process for both the top and bottom FETs together. One or more embodiments of the invention use a gate cut to form a shared gate controlled complementary-FET device, an independent gate controlled complementary-FET device, and various combinations of the same.

In one or more embodiments of the invention, forming a complementary-FET device includes forming an extended dielectric bar which is longer than the nanosheets in top and bottom channels where the dielectric bar separates top and bottom channels of stacked devices, forming at least a lower spacer abutting one side of the dielectric bar, and forming at least a top gate cut abutting the other side of the dielectric bar. The combination of the lower spacer, dielectric bar, and top gate cut isolate the gates of the stacked devices.

In one or more embodiments of the invention, forming a complementary-FET device includes forming a bottom dummy gate for a bottom FET, bonding (a second channel) a top FET over the bottom FET, forming top a dummy gate for the top FET, and forming a gate opening to the top and bottom dummy gate, through the bonding dielectric, and defining a bonding dielectric edge. The dummy gate is removed, and a replacement gate is formed for the top and bottom FETs. A late cut is performed, such that the late cut does not touch the bonding dielectric edge for the shared gate device, and the late cut touches the bonding dielectric edge for the independent gate device.

Turning now to a more detailed description of aspects of the present invention, FIG. 1 depicts a top view of a simplified illustration of a portion of an integrated circuit (IC) 100 having a stacked FET device according to one or more embodiments of the invention. As depicted in FIG. 1, an "X-X" view is taken in the gate length direction of the stacked FET device perpendicular to the gate structure, while a "Y-Y" view is taken in a gate width direction of the stacked FET device along an axial length of the gate structure.

FIGS. 2-15B depict the IC 100 after selected fabrication operations have been completed for forming the stacked FET device with vertically stacked P-type and N-type FETs such as top and bottom devices 1350, 1355 according to one or more embodiments of the invention. Standard semiconductor fabrication techniques can be utilized to fabricate IC 100 as understood by one of ordinary skill in the art. Any suitable lithography processes including deposition techniques and etching techniques can be utilized herein.

FIG. 2 depicts a cross-sectional view of a portion of the IC 100 after fabrication operations according to one or more embodiments of the invention. In the examples depicted herein, the complementary-FET devices of IC 100 will be formed in and above a semiconductor layer 202. The initial wafer may have a variety of configurations, such as the depicted semiconductor-on-insulator (SOI) configuration that includes a bulk semiconductor layer, a buried insulation layer positioned on the bulk substrate, and one or more semiconductor material layers positioned on the buried insulation layer resulting in buried isolation scheme. In one or more embodiments, semiconductor layer 202 may be a bulk configuration. Also, semiconductor layer 202 may be made of silicon or it may be made of materials other than silicon, e.g., silicon-germanium, a III-V compound semiconductor material, etc. The buried insulator layer 204 can be an oxide, also called BOX $SiO_2$. The initial semiconductor layer above the BOX $SiO_2$ could be a thin SiGe layer (210) or a Si layer that is later converted to a SiGe layer by SiGe epitaxy growth and SiGe condensation The terms "substrate" or "semiconductor substrate" should be understood to cover all semiconducting materials and all forms of such materials. Note that one or more embodiments use SOI wafer as starting substrate for illustration purposes, and one or more embodiments of the inventions apply to any kind of starting wafers, such as bulk Si wafers, III-V wafers, etc.

FIG. 2 depicts the IC 100 at a point in fabrication where several process operations have been performed. First, a nanosheet stack 206 of semiconductor material layers 212, 210, 214 is formed above the $1^{st}$ semiconductor layer 210 above the BOX $SiO_2$. In one or more embodiments, the nanosheet stack 206 may be patterned to a fin-like structure (i.e., a stack of nanosheets having a narrow width compared to its axial length). A hard mask layer 220 (e.g., silicon nitride) formed above nanosheet stack 206 is used for the fin patterning process. An etching process is performed using the hard mask layer 220 to define the nanosheet stack 206. In general, the semiconductor material layers 210, 212, 214 are made of different semiconductor materials such that they may be selectively removed (by etching) relative to one another. In the examples depicted herein, the semiconductor material layers 210, 214 are sacrificial in nature while the semiconductor material layers 212 will become the channel region material for the stacked FET device. In one or more embodiments, the semiconductor material layer 212 may include substantially pure silicon, the semiconductor material layer 210 may include silicon germanium (SiGe) where germanium has an atomic percent (%) of about 30%, thereby leaving silicon with an atomic percent of about 70%. In semiconductor material layer 210, the atomic percent of germanium may range from about 20-35%, while silicon is the remainder. Semiconductor material layer 214 may include silicon germanium, where the atomic percent of germanium is about 60%. In semiconductor material layer 214, the atomic percent of germanium may range from about 50-65%, while silicon is the remainder. In one or more embodiments, the thicknesses of semiconductor material layers 210, 212, 214 may be about the same. In one or more embodiments, the thicknesses of the semiconductor material layers 210, 212, 214 may vary depending upon the particular application and they need not have the same thicknesses.

The middle semiconductor material layer 214 divides the complementary-FET device into an upper portion 250 and a lower portion 255. In one or more embodiments, the upper portion 250 may be associated with an N-type transistor, and the lower portion 255 may be associated with a P-type transistor; in one or more embodiments, these could be reversed. In one or more embodiments, both upper portion 250 and lower portion 255 could be P-type transistors or N-type transistors. The number of semiconductor material layers 210, 212 that are formed for the upper and lower portions may vary depending upon the particular application.

FIG. 3 depicts a cross-sectional view of a portion of the IC 100 after fabrication operations according to one or more embodiments of the invention. A sacrificial anchoring layer 302 is formed on nanosheet stack 206 and patterned to expose one side of nanosheet stack 206. Sacrificial anchoring layer 302 may be formed of titanium oxide ($TiO_x$). In one or more embodiments, other example materials of sacrificial anchoring layer 302 may include $AlO_x$, TiN, etc. A selective etch is performed to remove semiconductor material layer 214. An isotropic etch may be performed to remove semiconductor material layer 214 while not removing semiconductor material layers 210, 212, thereby creating a cavity 304. An example etchant that selectively etches semiconductor material layer 214 may include vapor phased HCl at a suitable temperature and pressure.

FIG. 4 depicts a cross-sectional view of a portion of the IC 100 after fabrication operations according to one or more embodiments of the invention. A dielectric isolation layer 402 is formed to fill the cavity 304 (e.g., depicted in FIG. 3). Dielectric isolation layer 402 provides dielectric isolation between upper and lower stacks/portions 250, 255. Dielectric isolation layer 402 may be deposited using ALD, CVD, or any other suitable deposition technique. Example materials of dielectric isolation layer 402 may include silicon carbide (SiC), silicon carbon oxygen (SiCO), SiOCN, SiBCN, etc. Any excess material of dielectric isolation layer 402 can be removed by a selective isotropic etching process.

FIG. 5 depicts a cross-sectional view of a portion of the IC 100 after fabrication operations according to one or more embodiments of the invention. Sacrificial anchoring layer 302 is removed. For example, sacrificial anchoring layer 302 can be removed by a wet or dry etch. Subsequently, semiconductor material layers 210, 212 may be trimmed using a wet or dry etch. For example, an isotropic etch may be used to selectively etch semiconductor material layers 210, 212 while not etching dielectric isolation layer 402. This results in dielectric isolation layer 402 have a greater width than semiconductor material layers 210, 212 in the y-dimension. An example process that selectively etches semiconductor material layers 210, 212 may include a cyclic wet TMAH and dry HCl etch process.

Figure 6:
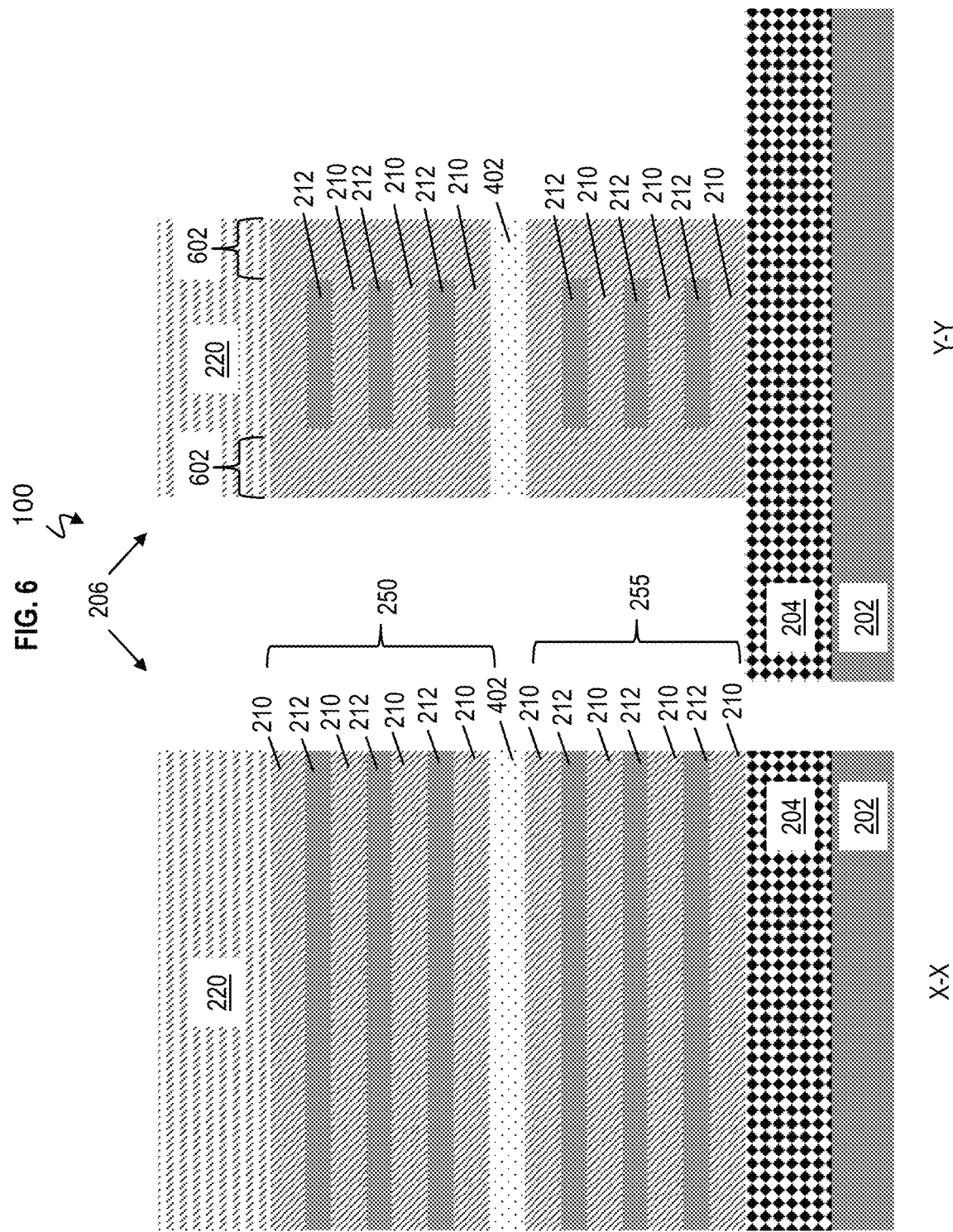
FIG. 6 depicts a cross-sectional view of a portion of an IC under-fabrication after fabrication operations according to one or more embodiments of the invention.

FIG. 6 depicts a cross-sectional view of a portion of the IC 100 after fabrication operations according to one or more embodiments of the invention. A conformal deposition of silicon germanium (SiGe) is performed followed by an anisotropic reactive ion etch (RIE) to selectively remove any excess SiGe material not covered by hard mask layer 220. This results in additional semiconductor material 602 on the sides of semiconductor material layers 210, 212. The deposited SiGe material of additional semiconductor material 602 is the same as the material of semiconductor material layer 210 such that the material can be etched selectively.

Figure 7:
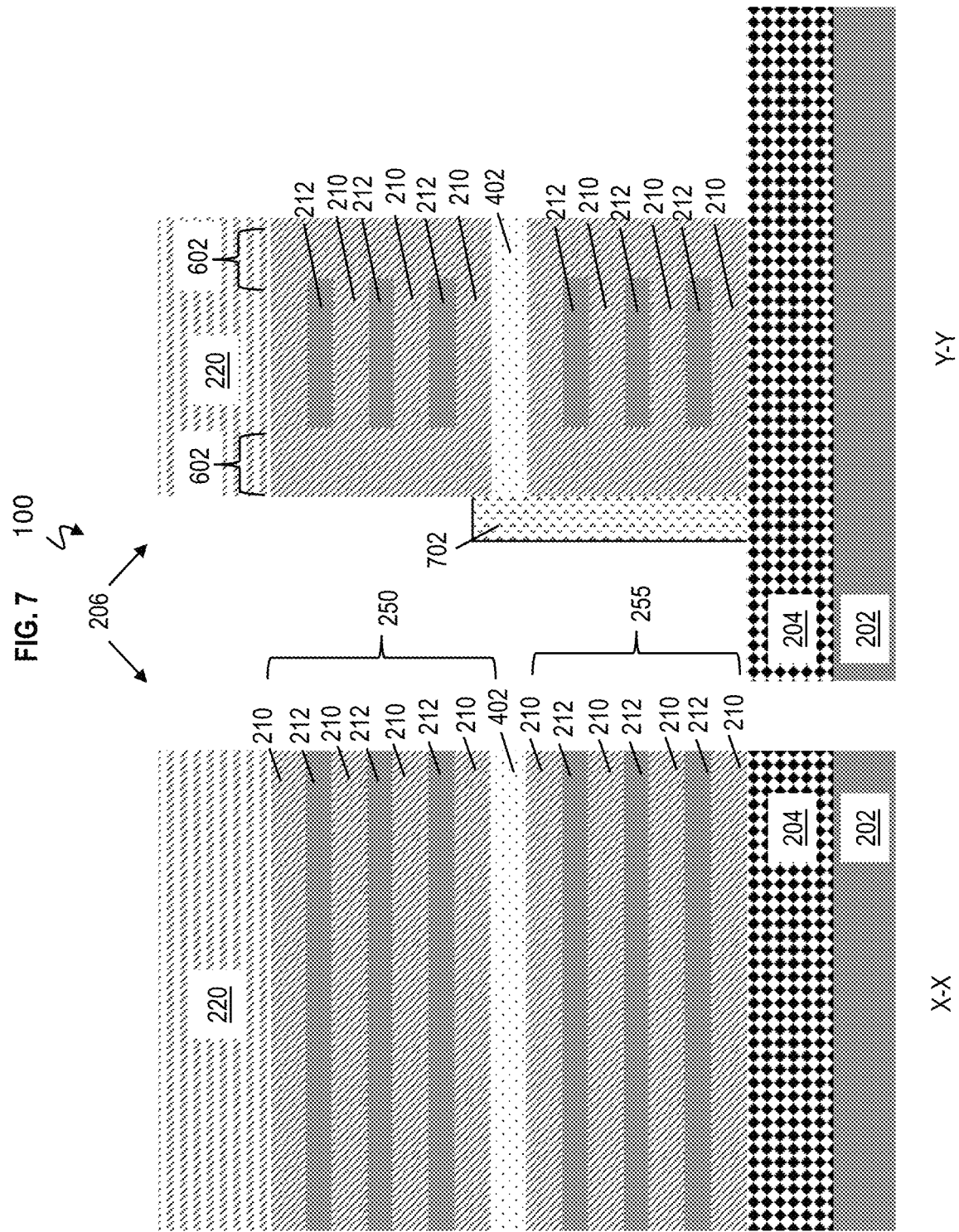
FIG. 7 depicts a cross-sectional view of a portion of an IC under-fabrication after fabrication operations according to one or more embodiments of the invention.

FIG. 7 depicts a cross-sectional view of a portion of the IC 100 after fabrication operations according to one or more embodiments of the invention. Lithography processes are performed to form lower spacer 702 on the sides of semiconductor material layers 210, 212 and additional semiconductor material 602. To form lower spacer 702, a conformal layer deposition of spacer material is formed on nanosheet stack 206 and an anisotropic etch (e.g., RIE) is performed to recess the spacer material resulting in lower spacer 702. Lower spacer 702 is recessed to a height above dielectric isolation layer 402. After that, a mask (e.g., an organic patterning layer (OPL) not shown) is formed and patterned on one side of nanosheet stack 206 while the side where lower spacer 702 is formed remains covered by the mask, and the exposed lower spacer is selectively removed by wet or dry etch process. Example spacer materials of lower spacer 702 may include SiN, SiBCN, SiC, SiOC, etc. The lower spacer 702 is utilized for a stacked FET device with independent gate control (i.e., independent gate device). For a stacked FET device with shared gate control (i.e., shared gate device) as depicted in FIG. 15B, the lower spacer 702 at both sides are exposed during above mentioned patterning step and removed by the selective wet or dry etch process.

Figure 8:
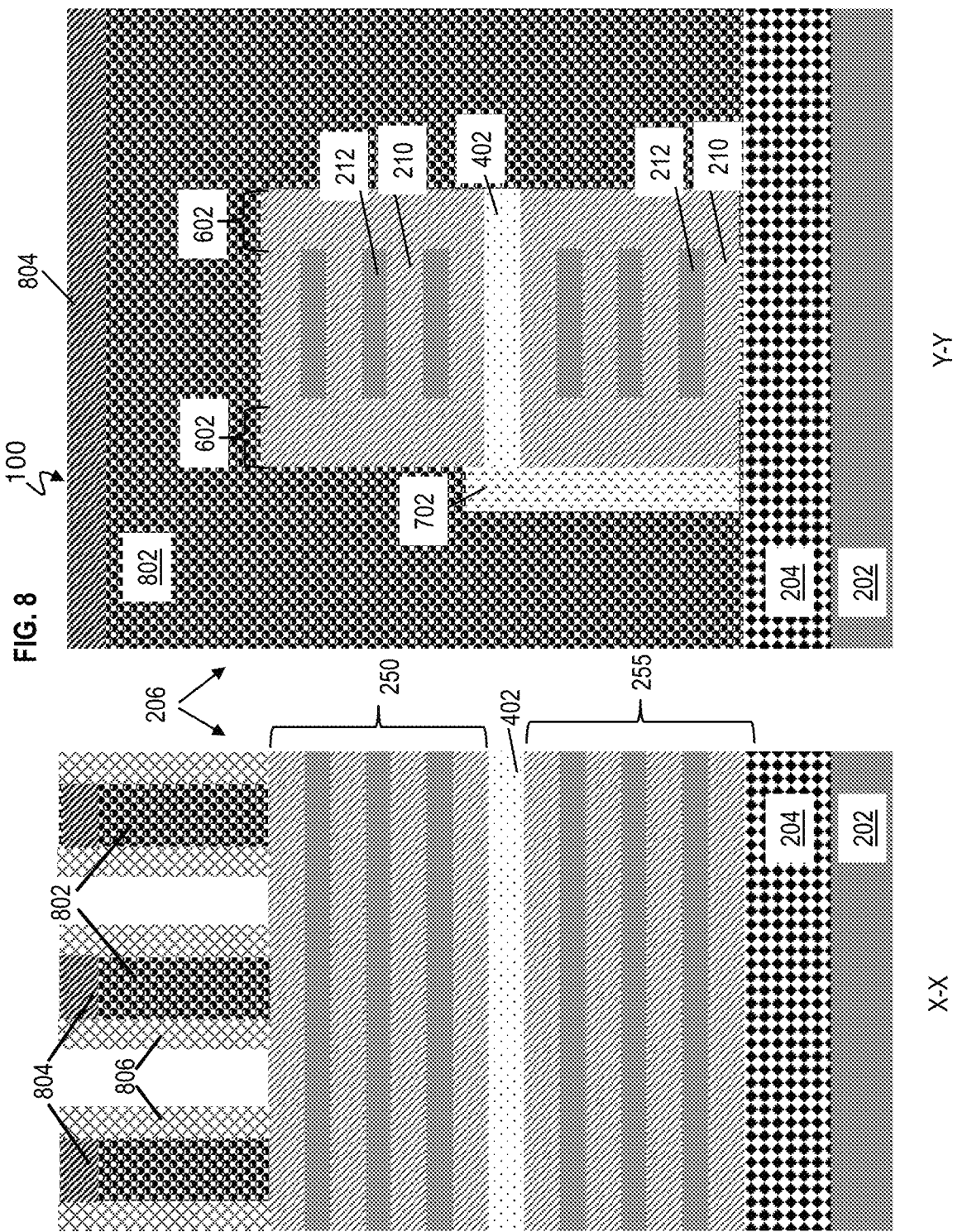
FIG. 8 depicts a cross-sectional view of a portion of an IC under-fabrication after fabrication operations according to one or more embodiments of the invention.

FIG. 8 depicts a cross-sectional view of a portion of the IC 100 after fabrication operations according to one or more embodiments of the invention. Hard mask layer 220 is stripped. Sacrificial gate structures 802 are formed on upper and lower stacks/portions 250, 255, contacting top and sidewall surfaces of the nanosheet stack 206. The sacrificial gate structures 802 are sacrificial in nature in that they are replaced at a later point in the process flow with other materials to form functional gate structures, as described below. Sacrificial gate structures 802 may include one or more layers of material, such as a sacrificial gate insulation layer (e.g., silicon dioxide) and/or a sacrificial gate material (e.g., amorphous silicon) which are not separately shown. Hard mask layers or cap layers 804 (e.g., silicon nitride or a stack including silicon nitride and silicon dioxide) are deposited over the sacrificial gate structure 802. Hard mask layer 804 and sacrificial gate structures 802 are then subsequently patterned by a conventional lithography and etch process. Sidewall spacers 806 are formed adjacent to sacrificial gate structures 802 (i.e., using a process similar to that described above for the lower spacer 702). Example materials of sidewall spacers 806 may include SiN, SiOCN, SiBCN, SiOC, etc.

FIG. 9 depicts a cross-sectional view of a portion of the IC 100 after fabrication operations according to one or more embodiments of the invention. An etch process is performed using the sacrificial gate structures 802 and sidewall spacers 806 as an etch mask to define source/drain cavities (not shown). An isotropic etch process is performed to recess the semiconductor material layers 210 to define end cavities on ends thereof. A conformal deposition process, such as an ALD process, is performed to form a layer of spacer material above the nanosheet stack 206 and the sacrificial gate structures 802, and the spacer layer is isotropically etched to define inner spacers 902 in the end cavities. Several deposition processes are performed to define a lower source/drain region 910 (e.g., N-type epitaxial material (or maybe P-type epitaxial material)), a source/drain epitaxy spacer 930 (e.g., dielectric material), and an upper source/drain regions 912 (e.g., P-type epitaxial material (or maybe N-type epitaxial material)) in the source/drain cavities (not shown). A dielectric layer 940 (e.g., interlayer dielectric layer (ILD)) is deposited and planarized to expose the sacrificial gate structures 802 (e.g., by removing the hard mask layer 804).

Figure 10:
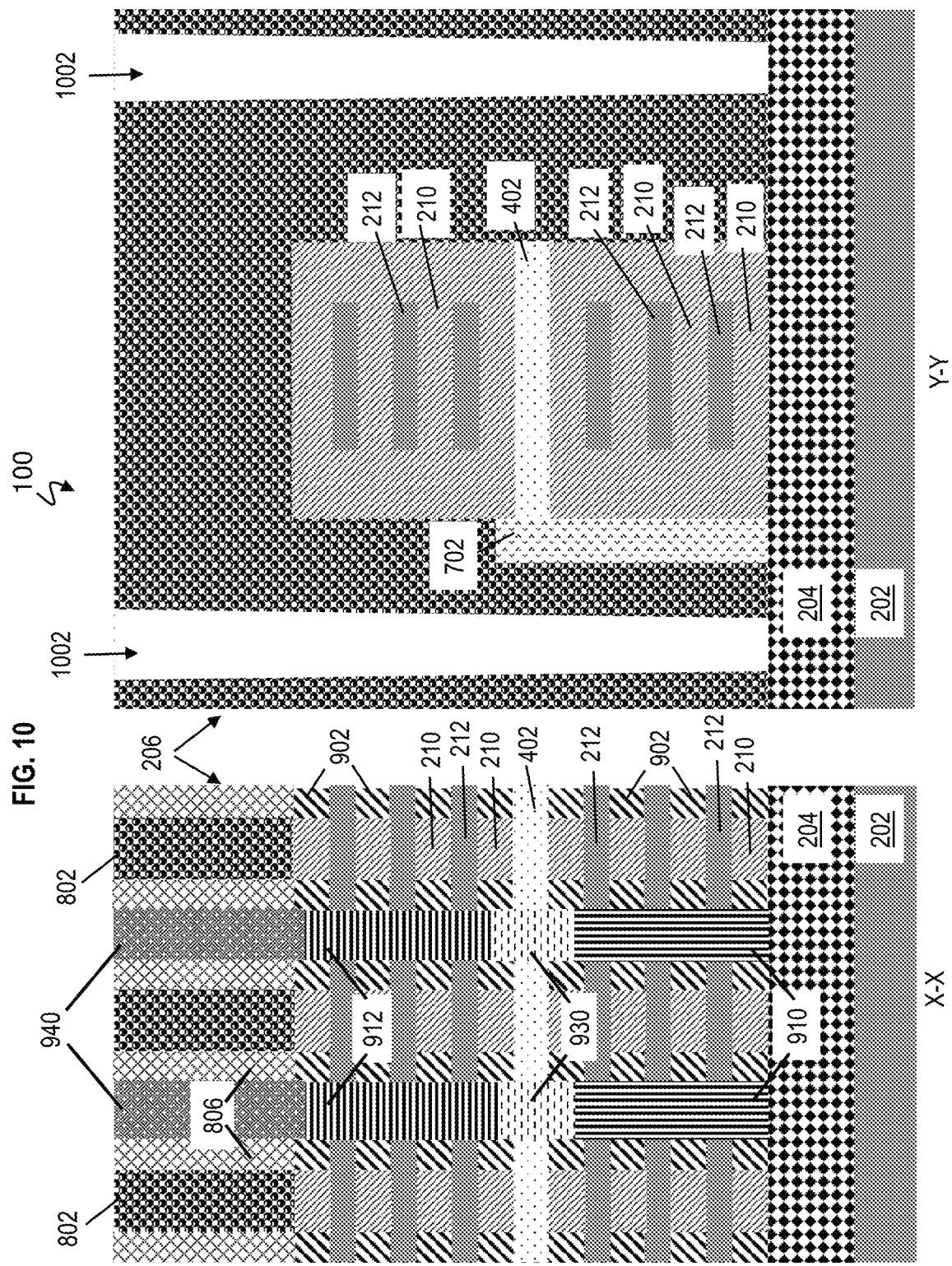
FIG. 10 depicts a cross-sectional view of a portion of an IC under-fabrication after fabrication operations according to one or more embodiments of the invention.

FIG. 10 depicts a cross-sectional view of a portion of the IC 100 after fabrication operations according to one or more embodiments of the invention. Etching is performed to form a full height cut in sacrificial gate structures 802 resulting in gate cut openings 1002. The gate cut openings 1002 cut through the full or entire height of sacrificial gate structures 802 thereby exposing BOX SiO$_2$ layer 204 underneath.

Figure 11:
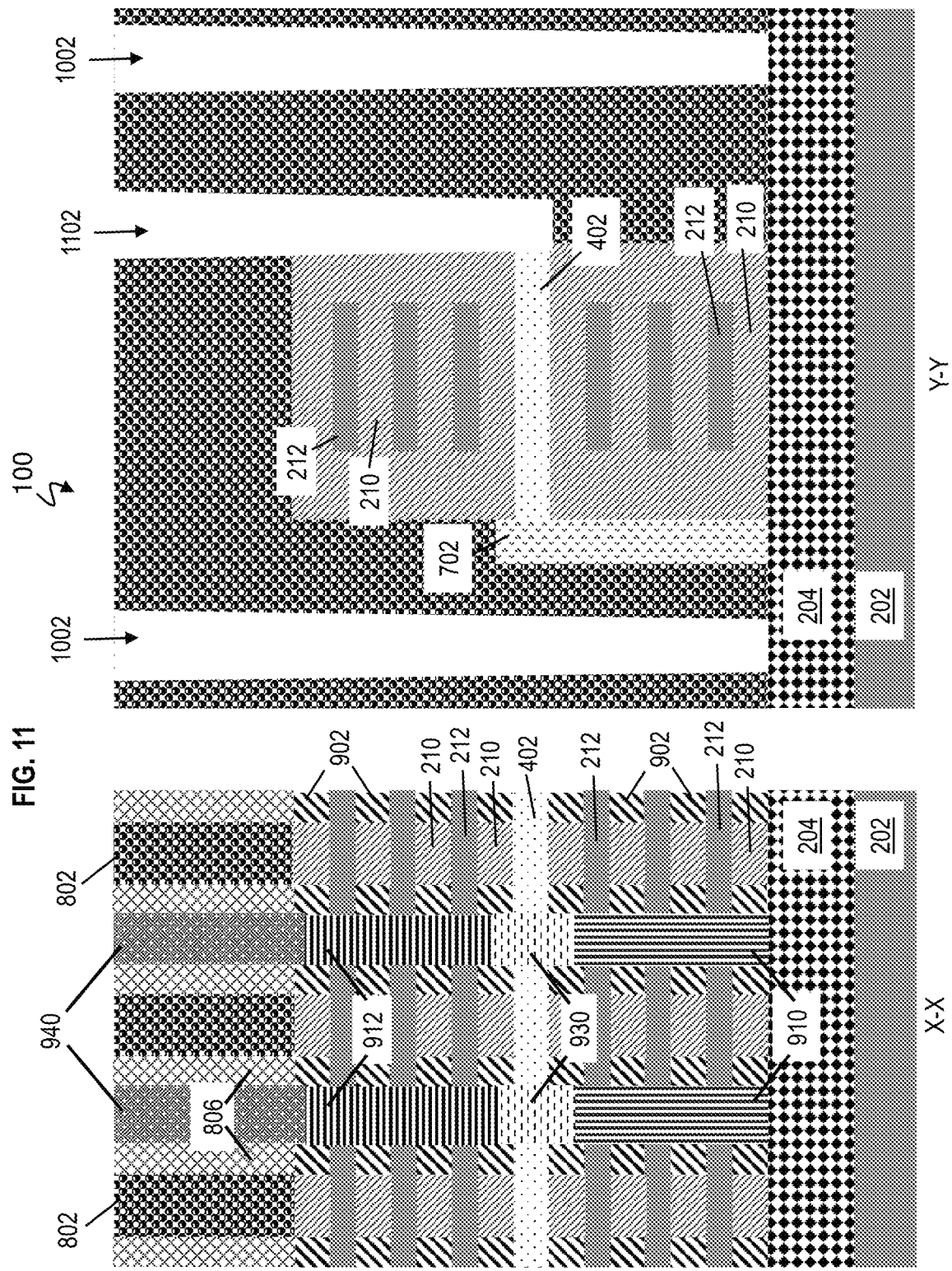
FIG. 11 depicts a cross-sectional view of a portion of an IC under-fabrication after fabrication operations according to one or more embodiments of the invention.

FIG. 11 depicts a cross-sectional view of a portion of the IC 100 after fabrication operations according to one or more embodiments of the invention. Etching is performed to form a less than full height cut in sacrificial gate structures 802 resulting in gate cut opening 1102. The gate cut opening 1102 cuts through part (e.g., at least half) of the sacrificial gate structures 802 thereby exposing the end surface of dielectric isolation layer 402. Gate cut opening 1102 can be formed to expose the end of dielectric isolation layer 402. In one or more embodiments, the gate cut opening 1102 can be into a portion of dielectric isolation layer 402, resulting in the final structure depicted in FIG. 15A. In one or more embodiments, the gate cut opening 1102 can be omitted and the lower spacer 702 can be removed, resulting in the final structure depicted in FIG. 15B.

Figure 12:
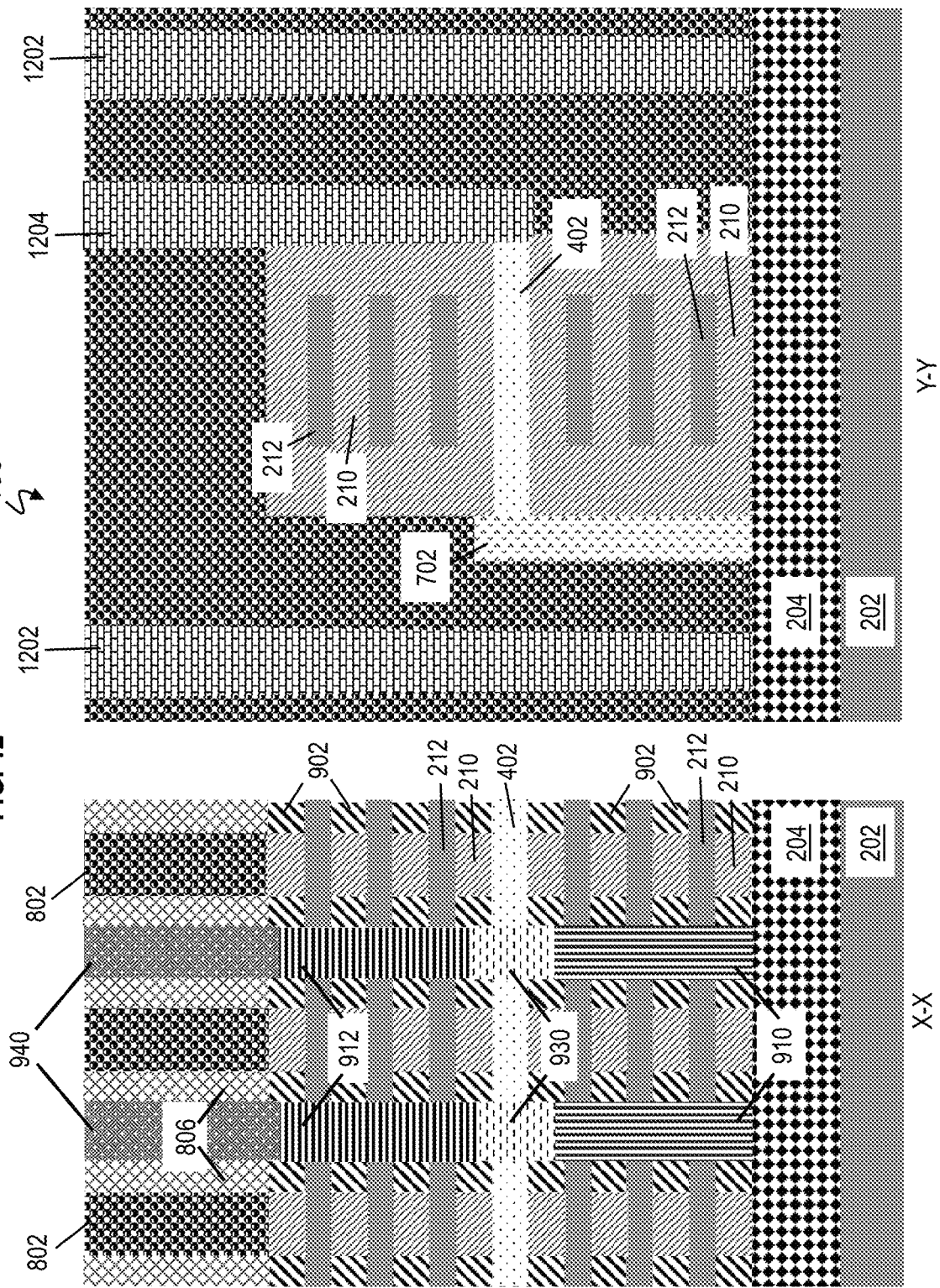
FIG. 12 depicts a cross-sectional view of a portion of an IC under-fabrication after fabrication operations according to one or more embodiments of the invention.

FIG. 12 depicts a cross-sectional view of a portion of the IC 100 after fabrication operations according to one or more embodiments of the invention. Deposition of dielectric material is performed to fill gate cut openings 1002 and 1102 (e.g., depicted in FIG. 11). The deposition and subsequent recess (or CMP) result in full height vertical dielectric layers 1202 and top vertical dielectric layer 1204. The bottom surface of full height vertical dielectric layers 1202 abut the BOX SiO$_2$ layer 204 underneath. A side surface of top vertical dielectric layer 1204 abuts the end surface of dielectric isolation layer 402. Example dielectric materials for full height vertical dielectric layers 1202 and top vertical dielectric layer 1204 may include SiN, SiBCN, SiOCN, SiOC, SiC, etc. In one or more embodiments, different dielectric materials may be utilized for full height vertical dielectric layers 1202 and top vertical dielectric layer 1204.

Figure 13:
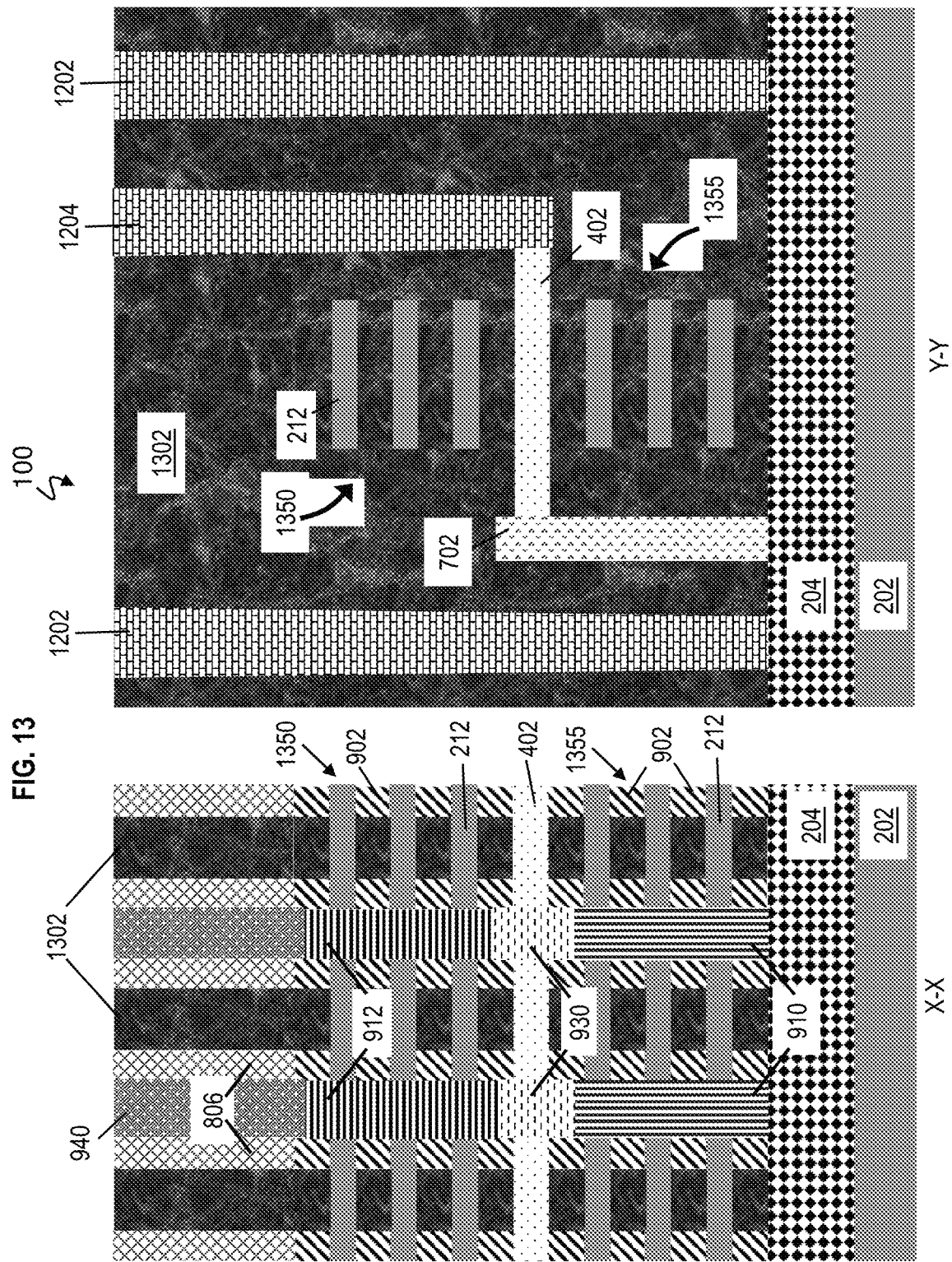
FIG. 13 depicts a cross-sectional view of a portion of an IC under-fabrication after fabrication operations according to one or more embodiments of the invention.

FIG. 13 depicts a cross-sectional view of a portion of the IC 100 after fabrication operations according to one or more embodiments of the invention. FIG. 13 depicts a final structure after dummy gate removal (e.g., sacrificial gate structures 802 are removed), SiGe release (e.g., semiconductor material layers 210 and additional semiconductor material 602 (e.g., depicted in FIG. 6) are removed), and replacement metal gate (RMG) formation, thereby forming gate material 1302. After fabricating the stacked FET device, FIG. 13 depicts the final structure of a top FET device 1350 such as an NFET or PFET formed above dielectric isolation layer 402 and a bottom FET device 1355 such as an NFET or PFET formed below dielectric isolation layer 402. An etch (e.g., wet etch or dry etch) may be performed to remove sacrificial gate structures 802, and subsequently, an etch is performed to selectively remove semiconductor material layers 210. The replacement metal gate process is performed to deposit a high-k dielectric material followed by one or more work function material layers to thereby form gate material 1302. As seen in FIG. 13, full height vertical dielectric layers 1202 are the same height as and/or extend the full height of gate material 1302. The high-k dielectric material and work function materials are formed currently for both the top FET device 1350 and the bottom FET device 1355.

Techniques for forming high-k metal gate (HKMG) in gate openings are well-known in the art and, thus, the details have been omitted in order to allow the reader to focus on the salient aspects of the disclosed methods. However, it should be understood that such HKMG will generally include formation of one or more gate dielectric layers (e.g., a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack are not illustrated. For explanation purposes, a high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal.

Figure 14:
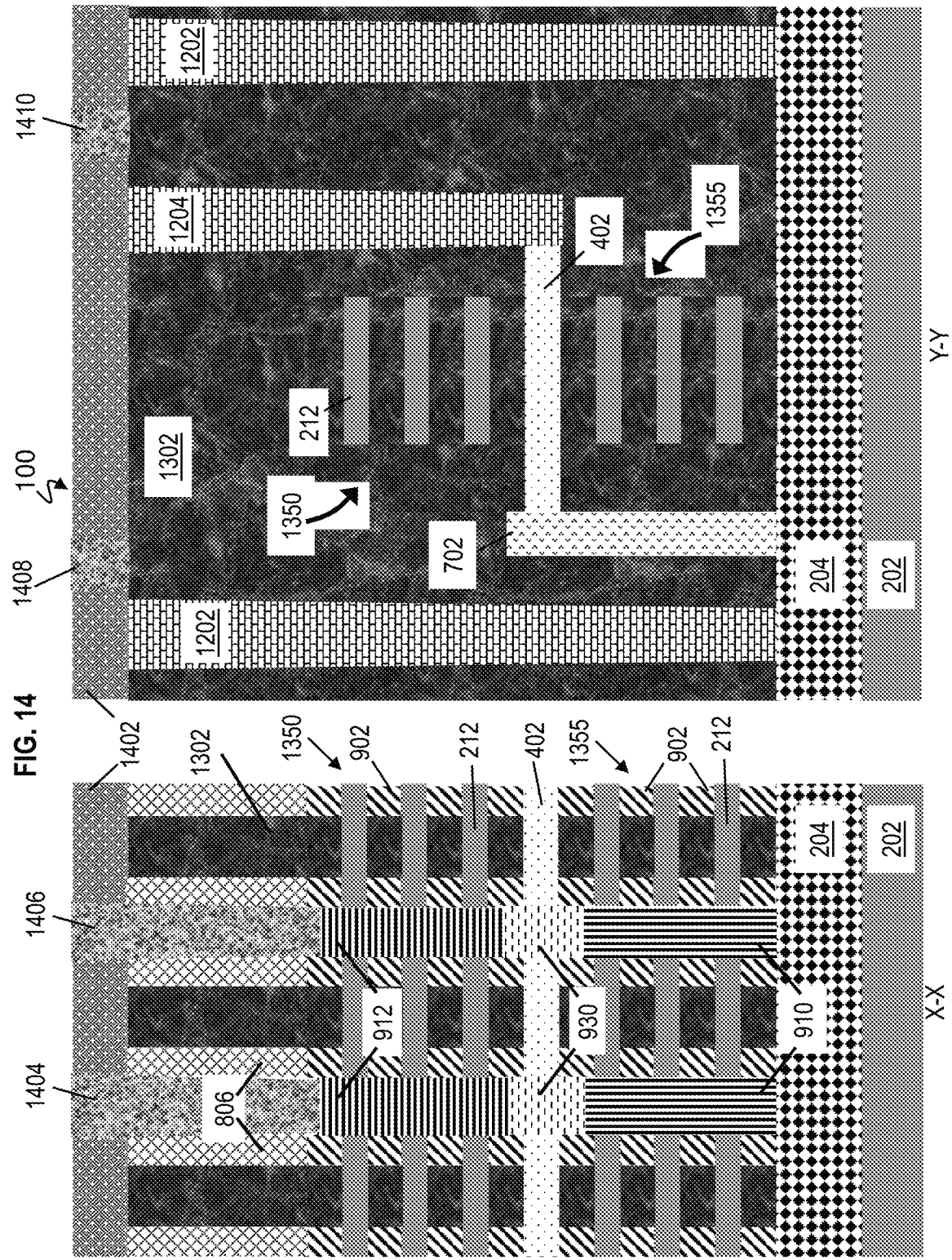
FIG. 14 depicts a cross-sectional view of a portion of an IC under-fabrication after fabrication operations according to one or more embodiments of the invention.

FIG. 14 depicts a cross-sectional view of a portion of the IC 100 after fabrication operations according to one or more embodiments of the invention. FIG. 14 depicts the final structure after contact formation. Interlayer dielectric (ILD) material 1402 is deposited and patterned to form source/drain contact cavities (not shown) both upper source/drain regions 912. Source/drain contacts 1404, 1406 are formed in the source/drain contact cavities extending through ILD material 1402 to contact upper source/drain regions 912, respectively. ILD material 1402 can be any standard dielectric material including silicon dioxide, etc. Gate contact cavities (not shown) are patterned in ILD material 1402 to expose gate material 1302 on opposite sides of top vertical dielectric layer 1204, and gate contacts 1408, 1410 are formed in the gate cavities to contact the underlying gate material 1302. In this configuration, the gate contact 1408 and gate contact 1410 are independent, thereby providing independent gate control of top FET device 1350 and bottom FET device 1355. The combination of lower spacer 702, (middle/horizontal) dielectric isolation layer 402, and top vertical dielectric layer 1204 is formed to both physically and electrically separate the gate material 1302 between top FET device 1350 and bottom FET device 1355. As seen in FIG. 14, gate contact 1408 is used to independently control the gate (i.e., gate material 1302) of top FET device 1350, while gate contact 1410 is used to independently control the gate (i.e., gate material 1302) of bottom FET device 1355. In FIG. 14, top FET device 1350 and bottom FET device 1355 are gate-all-around (GAA) transistors. Although not shown for conciseness, source/drain contacts are formed to contact lower source/drain regions 910 as understood by one of ordinary skill in the art. Gate contacts and source/drain contacts are formed on conductive materials, and in some cases, may also include a silicide.

Figure 15A:
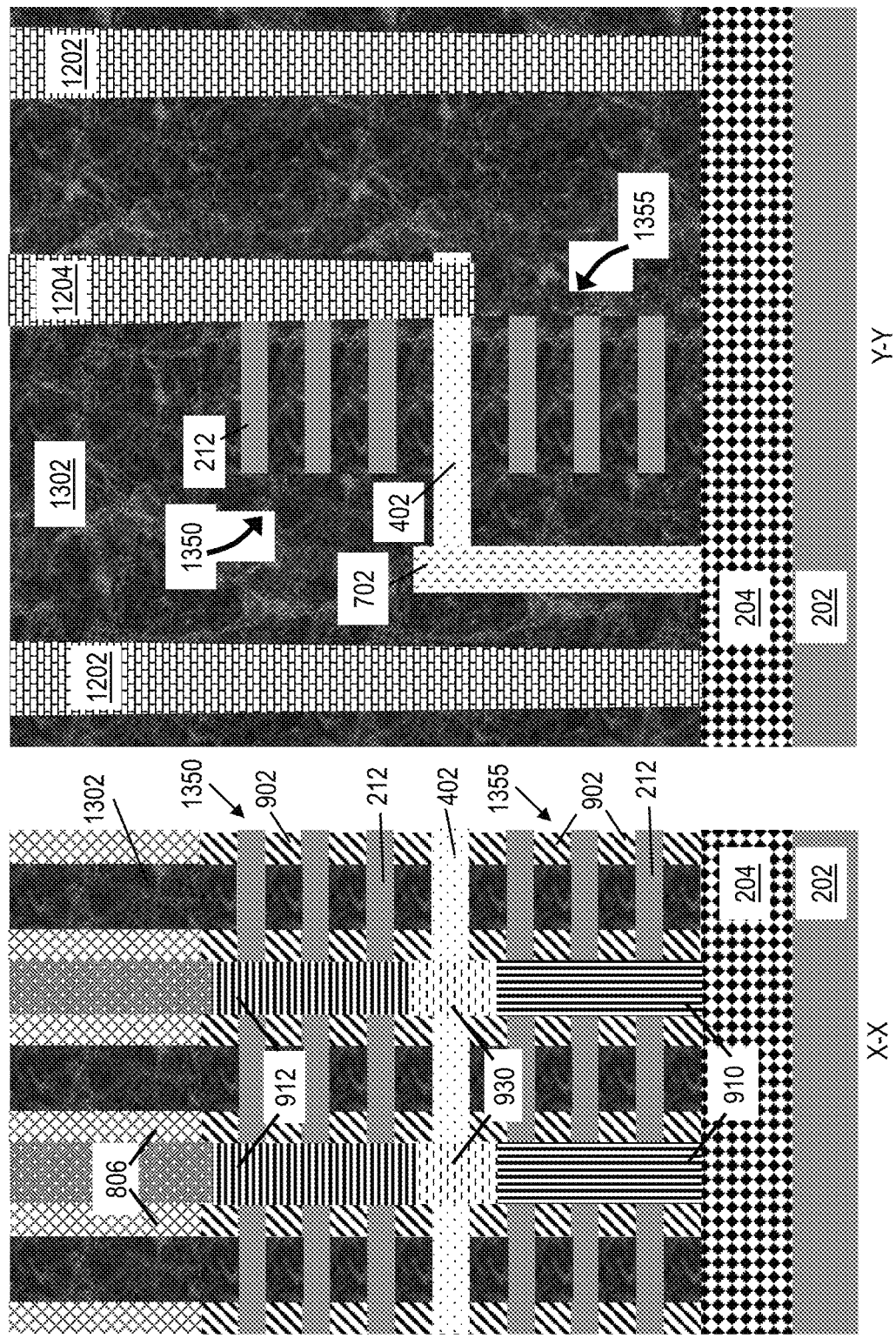
FIG. 15A depicts a cross-sectional view of a portion of an IC under-fabrication after fabrication operations according to one or more embodiments of the invention.
Figure 15B:
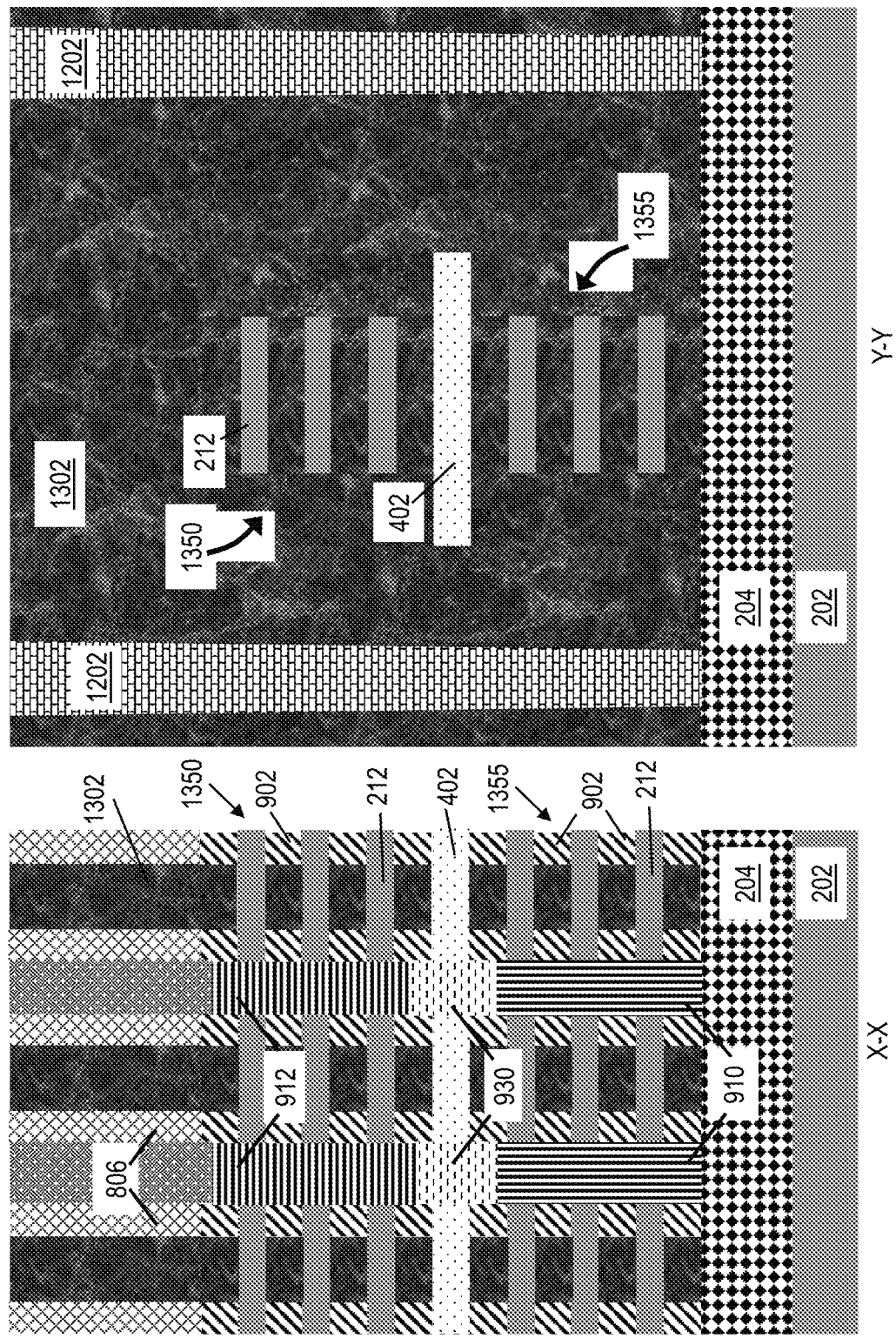
FIG. 15B depicts a cross-sectional view of a portion of an IC under-fabrication after fabrication operations according to one or more embodiments of the invention.

FIG. 15A depicts a cross-sectional view of a portion of the IC 100 after fabrication operations according to one or more embodiments of the invention. In one or more embodiments of the invention, the gate cut opening 1102 can be formed to expose the end surfaces of semiconductor material layers 212 of top FET device 1350, and top vertical dielectric layer 1204 is formed to abut the end surfaces of semiconductor material layers 212 as illustrated in FIG. 15A. Also, the gate cut opening 1102 can be formed in/through a portion of dielectric isolation layer 402, such that top vertical dielectric layer 1204 is formed in and/or through the portion of dielectric isolation layer 402. In FIG. 15A, top FET device 1350 is configured as a trigate device.

FIG. 15B depicts a cross-sectional view of a portion of the IC 100 after fabrication operations according to one or more embodiments of the invention. In one or more embodiments of the invention, the fabrication operations remove lower spacer 702 and do not form top vertical dielectric layer 1204 in this region, such that dielectric isolation layer 402 is not connected to lower spacer 702 and top vertical dielectric layer 1204 in FIG. 15B. This results in a shared gate device in which there is shared control of the gate (e.g., gate material 1302) controlling top FET device 1350 and bottom FET device 1355.

Various types of stacked FET devices are discussed herein. It should be appreciated that IC 100 and IC 1600 discussed in FIGS. 16A, 16B can include numerous stacked FET devices of all types on the same wafer according to one or more embodiments. For example, one or more independent gate controlled devices can be adjacent to one or more shared gate controlled devices and/or other independent gate controlled devices according to one or more embodiments of the invention. Further, the stacked FET devices discussed with respect to ICs 100 and 1600 can be formed together on the same wafer.

FIGS. 16A and 16B depict a top view of a simplified illustration of a portion of an integrated circuit (IC) 1600 having a stacked FET device according to one or more embodiments of the invention. As depicted in FIG. 16A, an "X-X" view is taken in the gate length direction of the stacked FET device perpendicular to the gate structure, while a "Y1-Y1" view is taken in a date width direction of the stacked FET device along an axial length of the gate structure. Similarly, in FIG. 16B, an "X-X" view is taken in the gate length direction of the stacked FET device perpendicular to the gate structure, while a "Y2-Y2" view is taken in a gate width direction of the stacked FET device along an axial length of the gate structure. The fabrication operations of FIGS. 16A and 16B are analogous for the X-X view and are therefore not separately detailed. Although initial fabrication operation may be the same, the fabrication operations in the Y1-Y1 view of FIG. 16A will differ from the Y2-Y2 view in FIG. 16B, and these differences will be illustrated in separate views. In one or more embodiments of the invention, FIGS. 16A and 16B denote different portions of the IC 1600 of the same wafer. In one or more embodiments of the invention, FIGS. 16A and 16B may be representative of two different ICs.

FIGS. 17-33 depict the IC 1600 after selected fabrication operations have been completed for forming the stacked FET devices with a vertically stacked first FET device 2650 and second FET device 2655 according to one or more embodiments of the invention. Standard semiconductor fabrication techniques can be utilized to fabricate IC 1600 as understood by one of ordinary skill in the art. Any suitable lithography processes including deposition techniques and etching techniques can be utilized herein.

FIG. 17 depicts a cross-sectional view of a portion of the IC 1600 after fabrication operations according to one or more embodiments of the invention. FIG. 17 illustrates bottom nanosheet patterning. Analogous to the discussion of FIG. 2 (with the exception of semiconductor material layer 214), a nanosheet stack of semiconductor material layers 210, 212 is formed above BOX $SiO_2$ layer 204. In one or more embodiments, the nanosheet stack may be a fin-like structure (i.e., a stack of nanosheets having a narrow width compared to its axial length). A hard mask layer (not shown) (e.g., silicon nitride) is formed above nanosheet stack. An etching process is performed using the hard mask layer to define the nanosheet stack resulting in the patterned nanosheet stack of semiconductor material layers 210, 212 in FIG. 17. In general, the semiconductor material layers 210, 212 are made of different semiconductor materials such that they may be selectively removed (by etching) relative to one another. In the examples depicted herein, the semiconductor material layers 210 are sacrificial in nature while the semiconductor material layers 212 will become the channel region material for the complementary-FET device. In one or more embodiments, the semiconductor material layer 212 may include substantially pure silicon, the semiconductor material layer 210 may include silicon germanium (SiGe) where germanium has an atomic percent (%) of about 30%, thereby leaving silicon with an atomic percent of about 70%. In semiconductor material layer 210, the atomic percent of germanium may range from about 25-35%, while silicon is the remainder. In one or more embodiments, the thicknesses of semiconductor material layers 210, 212 may be about the same. In one or more embodiments, the thicknesses of the semiconductor material layers 210, 212 may vary depending upon the particular application and they need not have the same thicknesses.

FIG. 18 depicts a cross-sectional view of a portion of the IC 1600 after fabrication operations according to one or more embodiments of the invention. FIG. 18 illustrates forming the dummy gate, gate spacer, inner spacer, source/drain epitaxial regions, and interlayer dielectric material using standard lithographic processes as understood by one of ordinary skill in the art. Sacrificial gate structures 1708 are formed on the nanosheet stack, contacting top and sidewall surfaces of the nanosheet stack. The sacrificial gate structures 1708 are sacrificial in nature in that they are replaced at a later point in the process flow with other materials to form functional gate structures, as described below. Sacrificial gate structures 1708 may include the materials of sacrificial gate structures 802. Sacrificial gate structures 1708 are deposited and subsequently patterned. Hard mask layers or cap layers (not shown) (e.g., silicon nitride or a stack including silicon nitride and silicon dioxide) are deposited and patterned above the gate structures 1708. Sidewall spacers 1706 are formed adjacent to sacrificial gate structures 1708. Sidewall spacers 1706 are analogous to and may include the materials discussed for sidewall spacers 806.

An etch process is performed using the sacrificial gate structures 1708 and sidewall spacers 1706 as an etch mask to define source/drain cavities (not shown). An isotropic etch process is performed to recess the semiconductor material layers 210 to define end cavities on ends thereof. A conformal deposition process, such as an ALD process, is performed to form a layer of spacer material above the nanosheet stack and the sacrificial gate structures 1706, and the spacer layer is isotropically etched to define inner spacers 1702 in the end cavities. Several deposition processes are performed to define lower source/drain regions 1710 (e.g., N-type epitaxial material or maybe P-type epitaxial material). It is noted that layer 204 has been recessed such that the epitaxial material of lower source/drain regions 1710 extends into layer 204 so as to be below the bottom surface of semiconductor material layer 210 and inner spacers 1702. A dielectric layer 1720 (e.g., interlayer dielectric layer (ILD)) is deposited and planarized to expose the sacrificial gate structures 1708 (e.g., by removing the hard mask layer).

Figure 19:
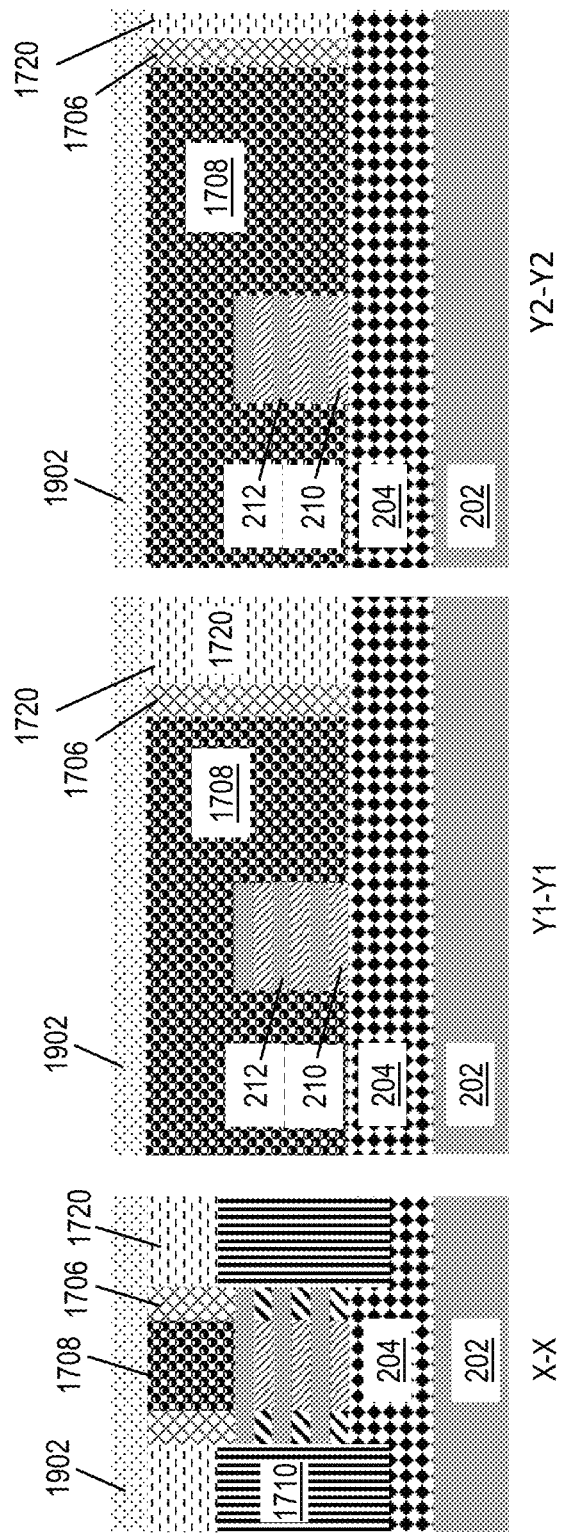
FIG. 19 depicts a cross-sectional view of a portion of an IC under-fabrication after fabrication operations according to one or more embodiments of the invention.

FIG. 19 depicts a cross-sectional view of a portion of the IC 1600 after fabrication operations according to one or more embodiments of the invention. FIG. 19 illustrates depositing a bonding material 1902 on top of the IC 100. Bonding material 1902 can be a dielectric material. Example materials for bonding material 1902 can include various oxides including silicon dioxide, SiN, SiC, etc.

Figure 20:
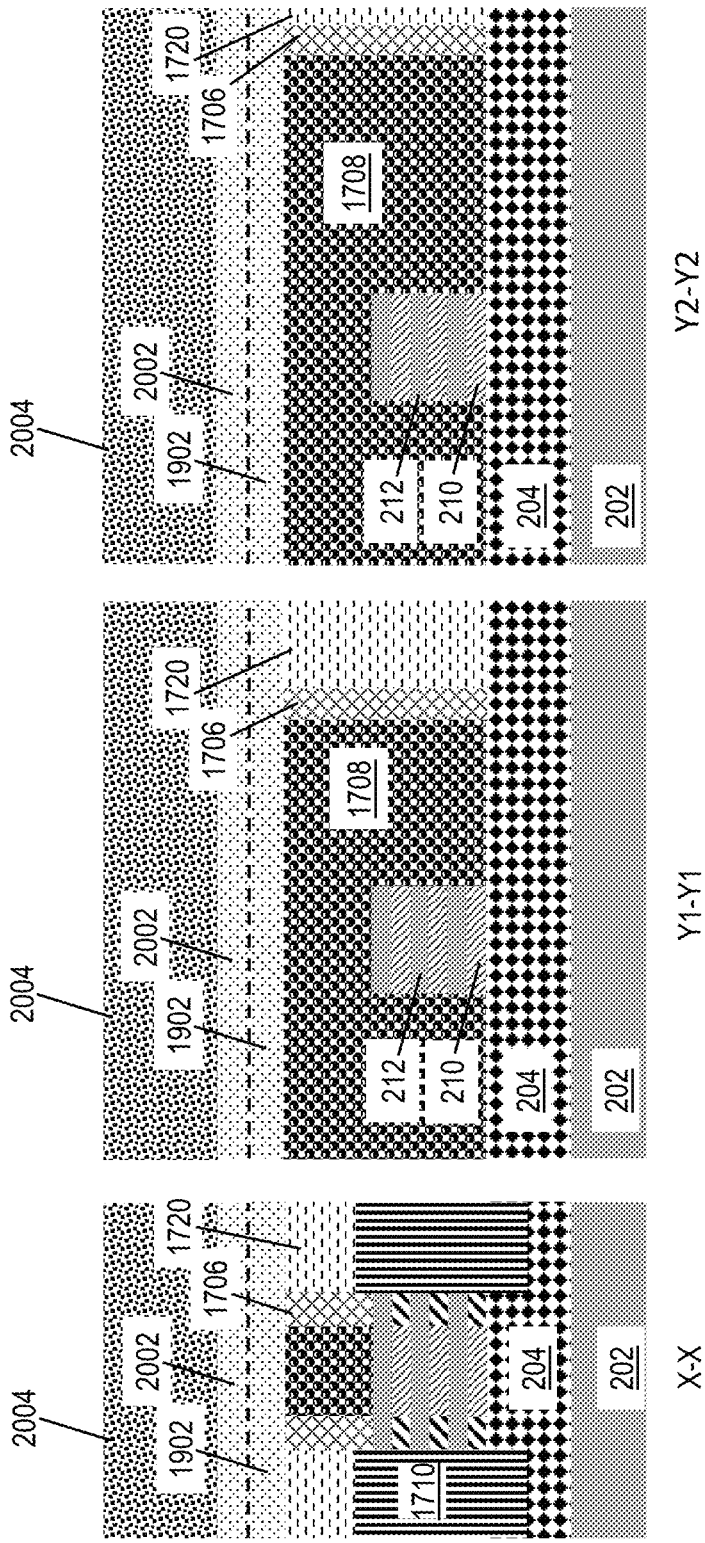
FIG. 20 depicts a cross-sectional view of a portion of an IC under-fabrication after fabrication operations according to one or more embodiments of the invention.

FIG. 20 depicts a cross-sectional view of a portion of the IC 1600 after fabrication operations according to one or more embodiments of the invention. In FIG. 20, fabrication operations include preparing a new wafer with bonding material 2002 over it, flipping the new wafer, and bonding the new wafer to the current wafer using dielectric bonding, such as oxide-to-oxide bonding to bond bonding material 2002 to bonding material 1902. The new wafer is thinned to a desired thickness for semiconductor layer 2004 (e.g., Si) which will be the top channel.

Figure 21:
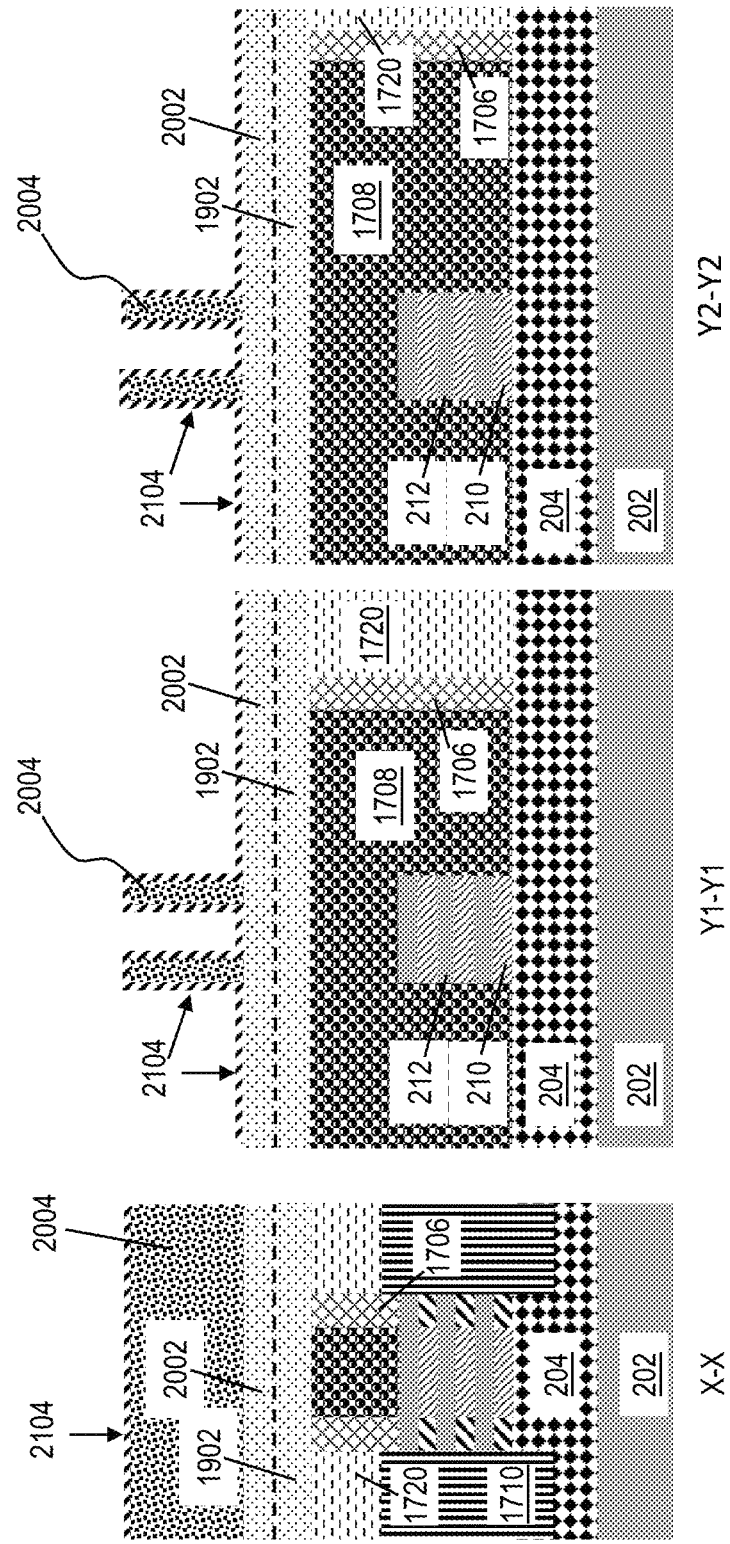
FIG. 21 depicts a cross-sectional view of a portion of an IC under-fabrication after fabrication operations according to one or more embodiments of the invention.

FIG. 21 depicts a cross-sectional view of a portion of the IC 1600 after fabrication operations according to one or more embodiments of the invention. In FIG. 21, fin patterning is performed and a protective liner 2104 is deposited different than the material of bonding material 2002. Conventional patterning processes can be used to form the Fins, like self-aligned double patterning (SADP), self-aligned quadruple patterning (SAQP), etc. Protective liner 2104 is deposited on the fins of semiconductor material layer 2004 if Fins are made of SiGe (for better mobility for PFET). In one or more embodiments if Fins are made of Si, protective liner 2104 may not be present. Examples of protective liner 2104 may be $HfO_2$, $AlO_x$, SiC, etc.

Figure 22:
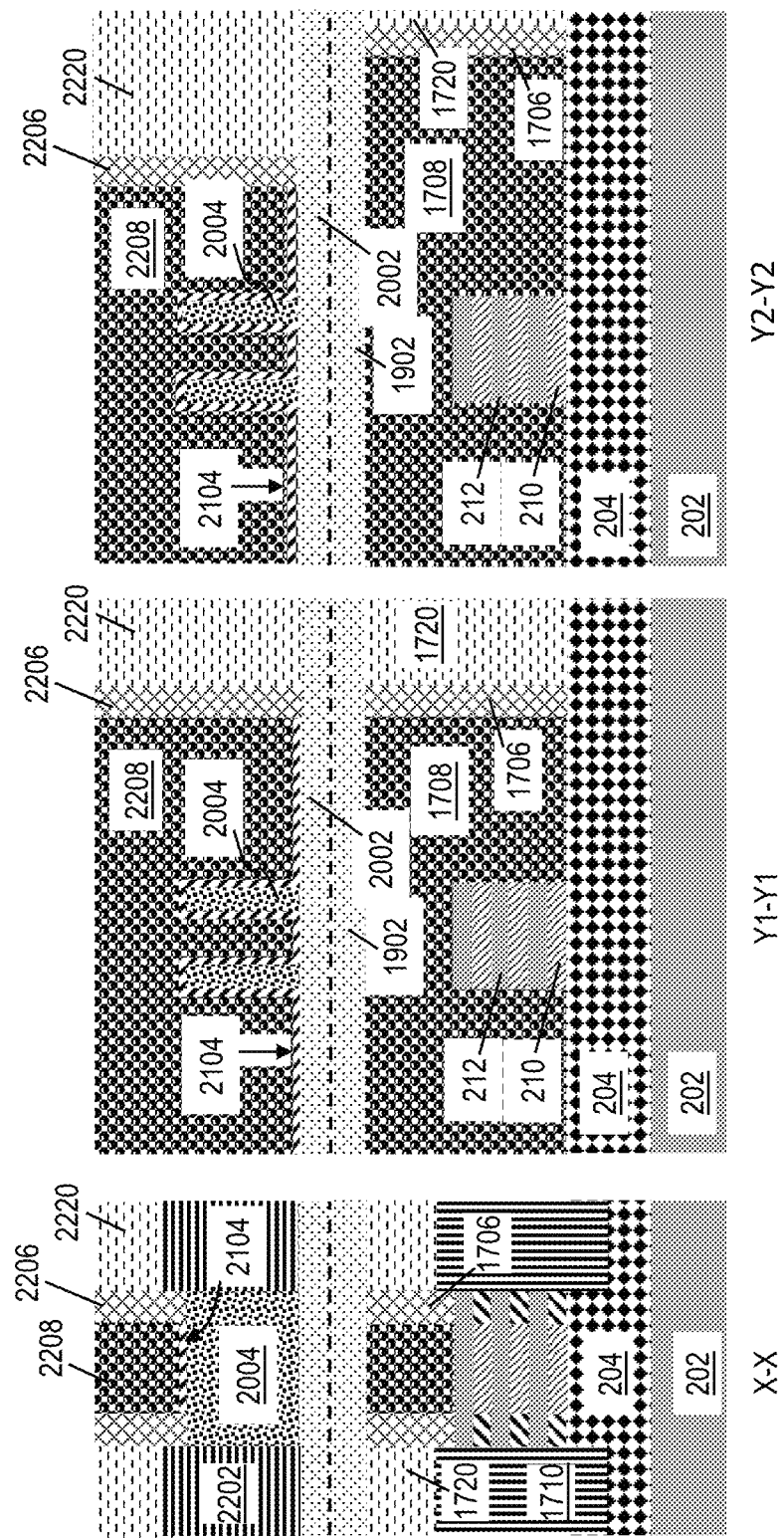
FIG. 22 depicts a cross-sectional view of a portion of an IC under-fabrication after fabrication operations according to one or more embodiments of the invention.

FIG. 22 depicts a cross-sectional view of a portion of the IC 1600 after fabrication operations according to one or more embodiments of the invention. FIG. 22 illustrates forming the dummy gate, gate spacer, inner spacer, source/drain epitaxial regions, and interlayer dielectric material using standard lithographic processes as understood by one of ordinary skill in the art. Sacrificial gate structures 2208 are formed on the fins of semiconductor material layer 2004, contacting top and sidewall surfaces of the fins. The sacrificial gate structures 2208 are sacrificial in nature in that they are replaced at a later point in the process flow with other materials to form functional gate structures, as described herein. Sacrificial gate structures 2208 may include the materials discussed for sacrificial gate structures 802, 1708. Sacrificial gate structures 2208 are deposited and subsequently patterned. Hard mask layers or cap layers (not shown) (e.g., silicon nitride or a stack including silicon nitride and silicon dioxide) are deposited and patterned above the gate structures 2208. Sidewall spacers 2206 are formed adjacent to sacrificial gate structures 2208. Sidewall spacers 2206 are analogous to and may include the materials discussed for sidewall spacers 806, 1706.

An etch process is performed using the sacrificial gate structures 2208 and sidewall spacers 2206 as an etch mask to define source/drain cavities (not shown). Several deposition processes are performed to define upper source/drain regions 2202 (e.g., N-type epitaxial material or maybe P-type epitaxial material). A dielectric layer 2220 (e.g., interlayer dielectric layer (ILD)) is deposited and planarized (e.g., CMP) to expose the sacrificial gate structures 2208 (e.g., by removing the hard mask layer). Dielectric layer 2220 may be the same material as dielectric layer 1720.

Figure 23:
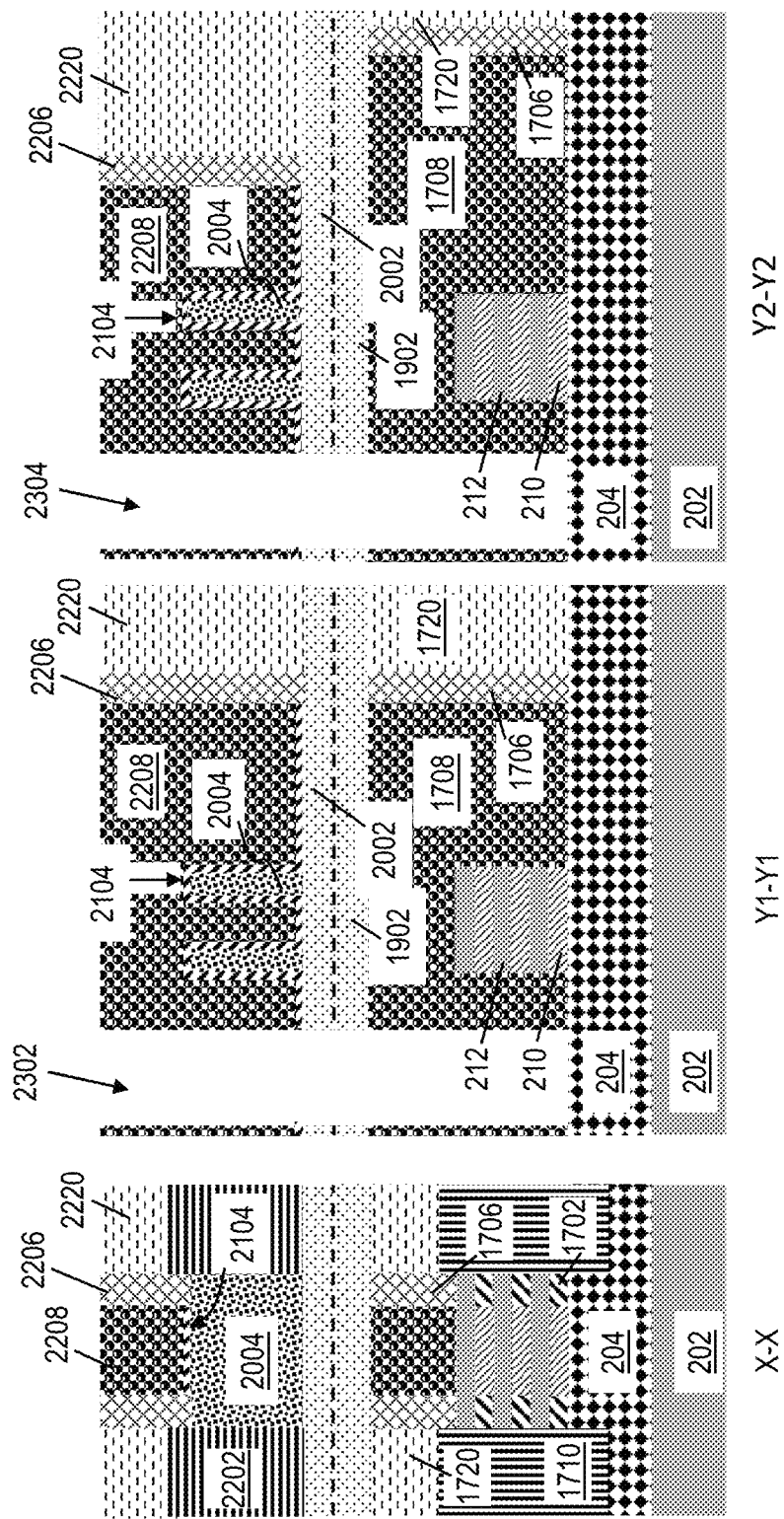
FIG. 23 depicts a cross-sectional view of a portion of an IC under-fabrication after fabrication operations according to one or more embodiments of the invention.

FIG. 23 depicts a cross-sectional view of a portion of the IC 1600 after fabrication operations according to one or more embodiments of the invention. FIG. 23 illustrates performing replacement metal gate opening patterning followed by a reactive ion etch. For example, mask layers (e.g., OPL mask) (not shown) can be formed and patterned on top of IC 1600, and etching is performed to create openings 2302, 2304. Openings 2302, 2304 extend through sacrificial gate structures 2208, bonding materials 1902, 2002, and sacrificial gate structures 1708 so as to expose BOX $SiO_2$ layer 204 underneath in preparation for dummy gate removal.

Figure 24:
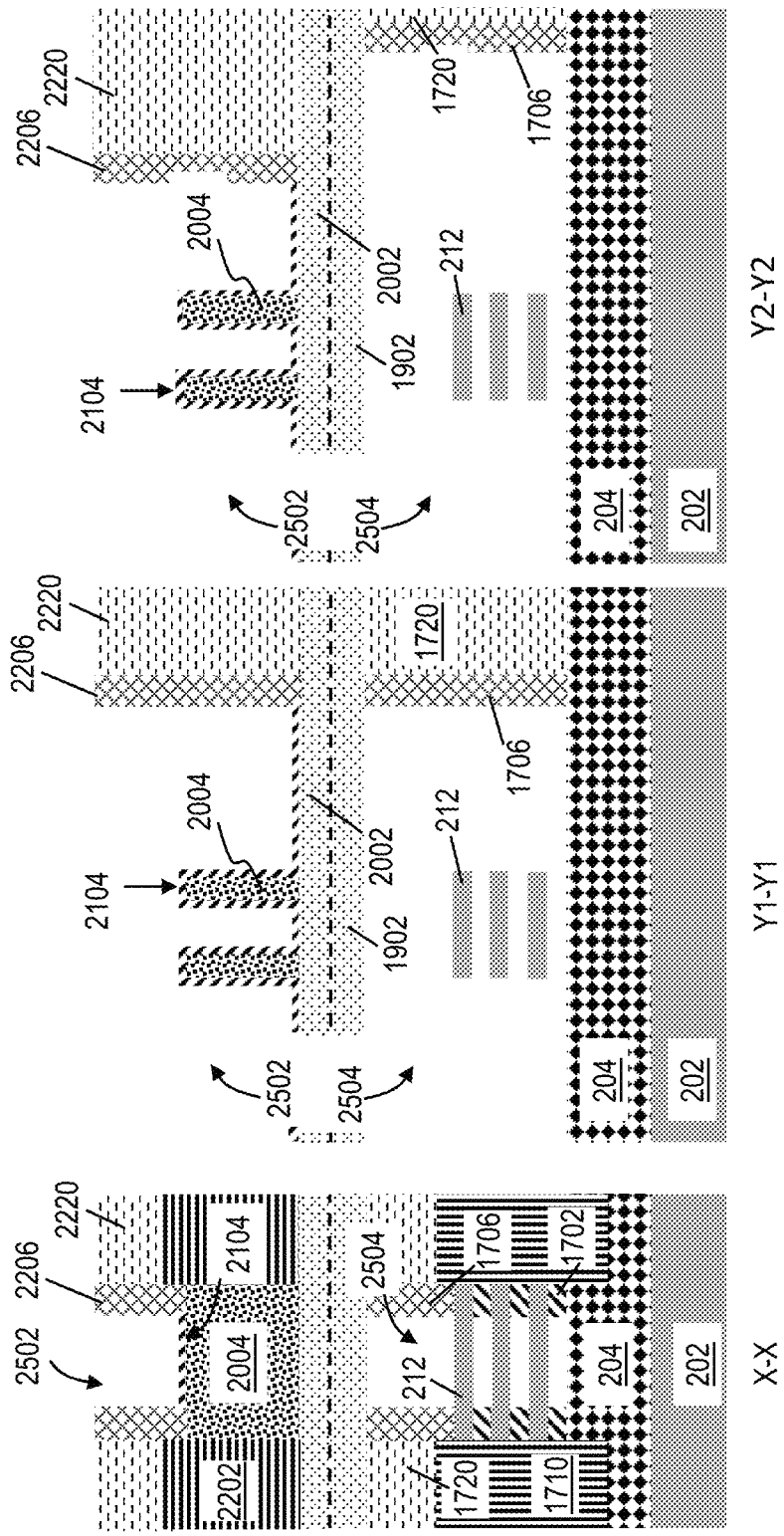
FIG. 24 depicts a cross-sectional view of a portion of an IC under-fabrication after fabrication operations according to one or more embodiments of the invention.

FIG. 24 depicts a cross-sectional view of a portion of the IC 1600 after fabrication operations according to one or more embodiments of the invention. FIG. 24 illustrates the IC 1600 after dummy gate removal (e.g., sacrificial gate structures 1708, 2208 are removed) and SiGe release (e.g., semiconductor material layers 210 are removed) in preparation for gate formation. An etch (e.g., wet etch or dry etch) may be performed to remove sacrificial gate structures 1708, 2208, and subsequently, an etch is performed to selectively remove semiconductor material layers 210, resulting in cavities 2502, 2504. It is noted that openings 2302, 2304 in FIG. 23 were utilized as openings to access sacrificial gate structure 1708 and semiconductor material layers 210 for removal.

Figure 25:
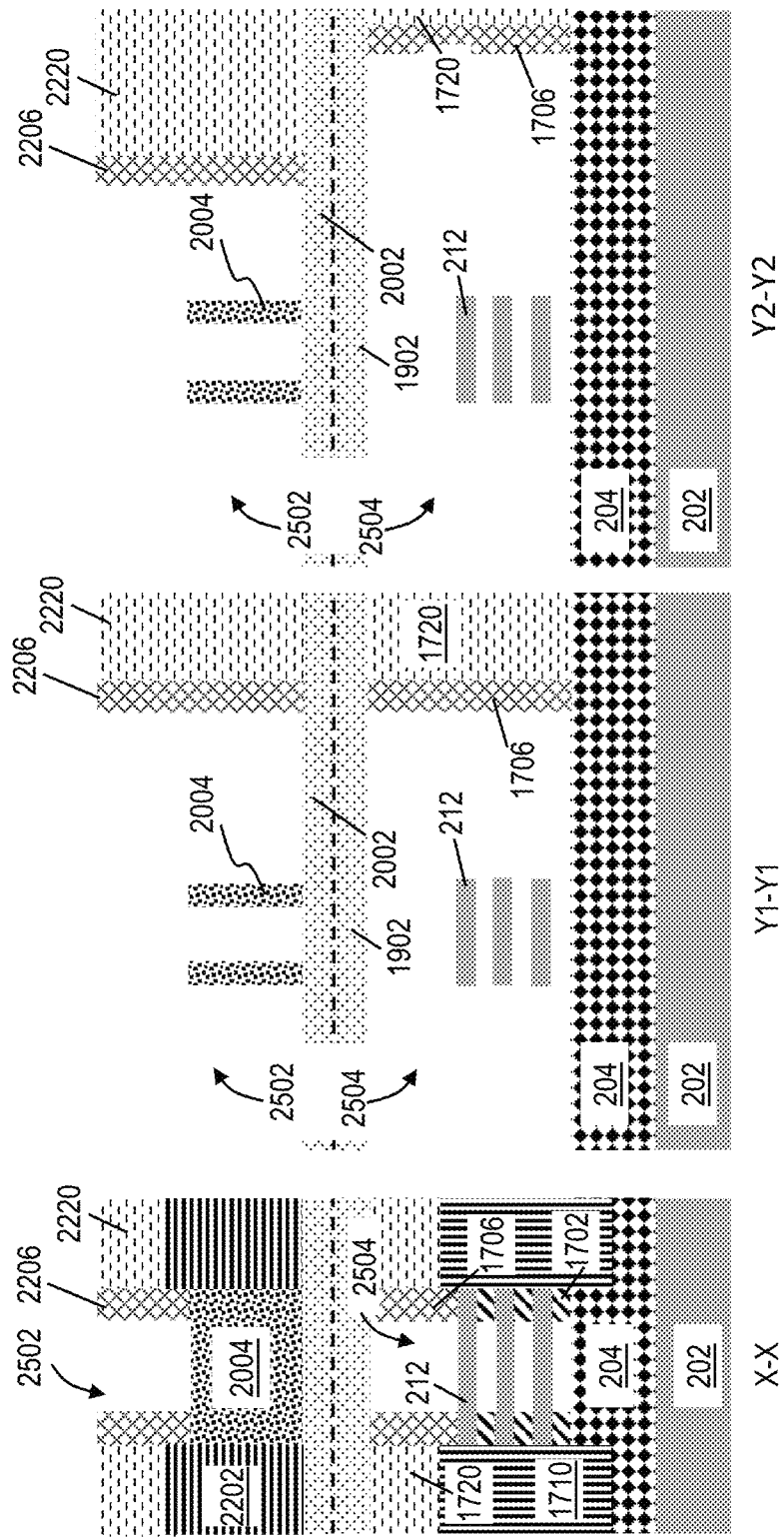
FIG. 25 depicts a cross-sectional view of a portion of an IC under-fabrication after fabrication operations according to one or more embodiments of the invention.

FIG. 25 depicts a cross-sectional view of a portion of the IC 1600 after fabrication operations according to one or more embodiments of the invention. FIG. 25 illustrates selectively removing the fin protective liner 2104.

Figure 26:
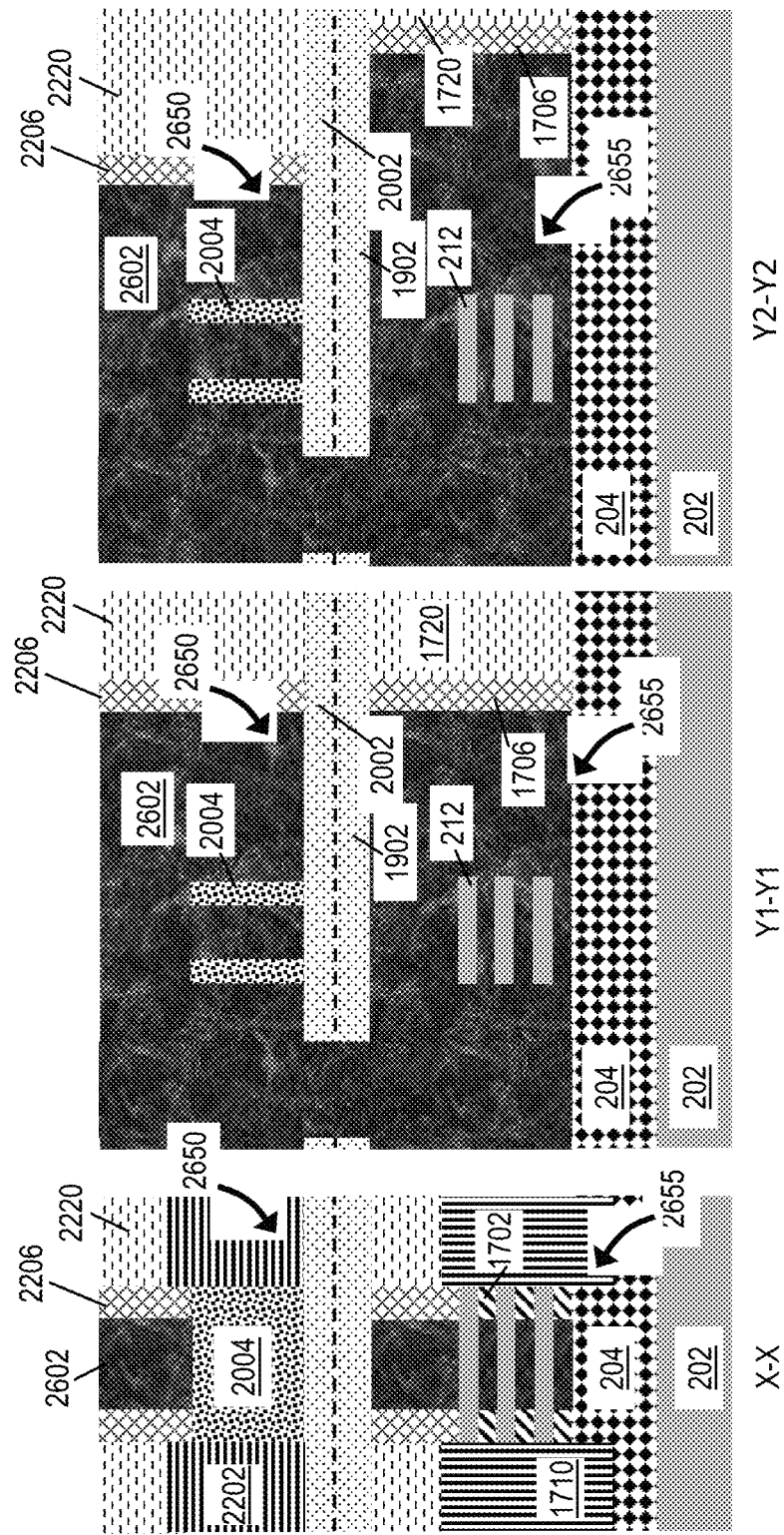
FIG. 26 depicts a cross-sectional view of a portion of an IC under-fabrication after fabrication operations according to one or more embodiments of the invention.

FIG. 26 depicts a cross-sectional view of a portion of the IC 1600 after fabrication operations according to one or more embodiments of the invention. FIG. 26 depicts a final structure after replacement metal gate (RMG) formation, thereby forming gate material 2602. Gate material 2602 may include materials discussed for gate material 1302. After fabricating the stacked FET device, FIG. 26 depicts a first FET device 2650 such as an NFET or PFET formed above bonding materials 1902, 2002 (i.e., a combined dielectric isolation layer) and a second FET device 2655 such as an NFET or PFET formed below bonding materials 1902, 2002 (i.e., the combined dielectric isolation layer).

Figure 27:
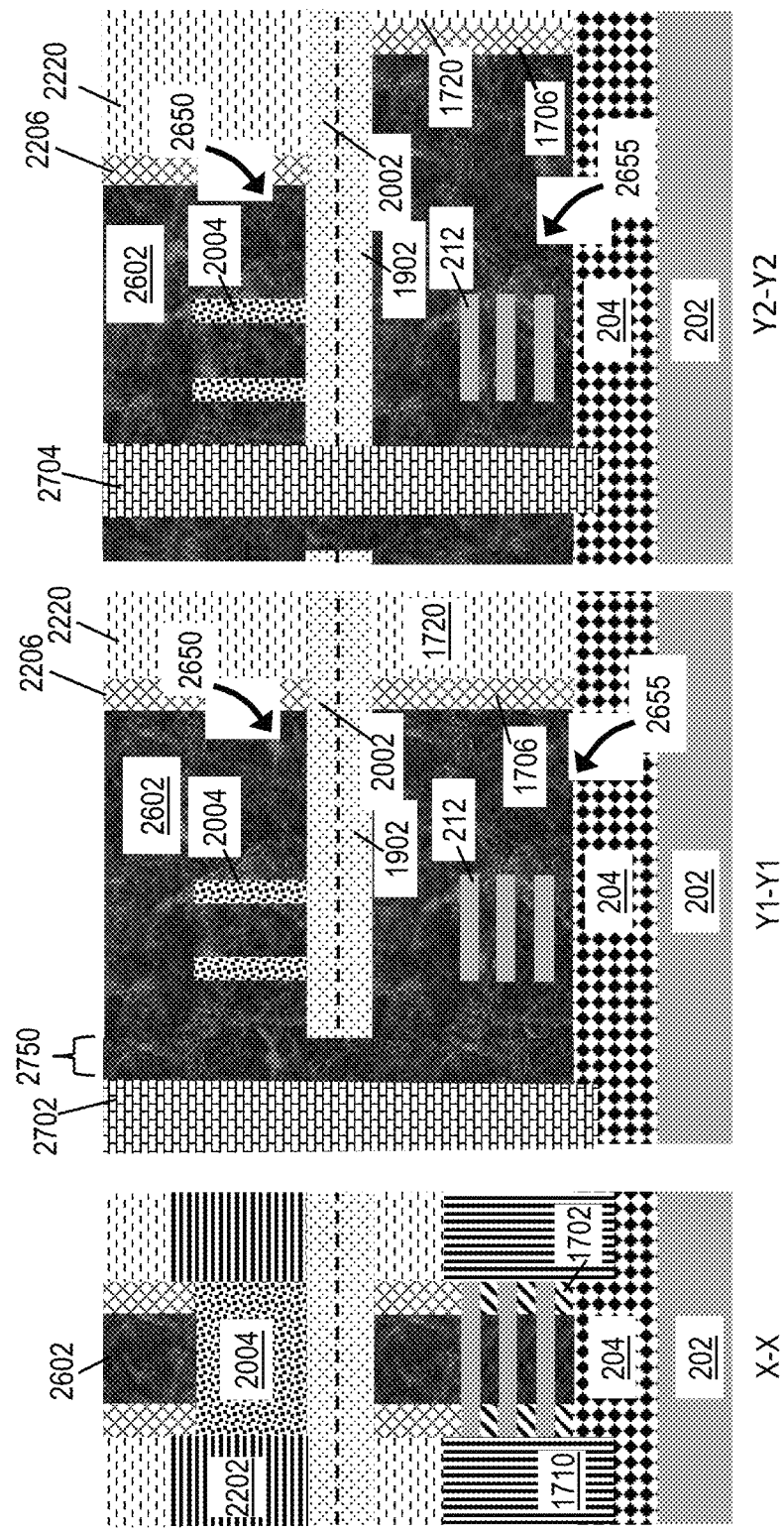
FIG. 27 depicts a cross-sectional view of a portion of an IC under-fabrication after fabrication operations according to one or more embodiments of the invention.

FIG. 27 depicts a cross-sectional view of a portion of the IC 1600 after fabrication operations according to one or more embodiments of the invention. Analogous to FIG. 10, etching is performed to form a full height cut in gate material 2602 resulting in full height gate cut openings (not shown but analogous to gate cut openings 1002 depicted in FIG. 10). The gate cut openings cut through the full and/or entire height of gate material 2602, thereby exposing and possibly cutting into a portion of BOX $SiO_2$ layer 204 underneath. It is noted that the position of the late gate cut (positioned to leave space/gap 2750) decides whether there is a shared gate CMOS device as depicted in Y1-Y1 view or an independent gate device as depicted in Y2-Y2 view. Deposition of dielectric material is performed to fill gate openings. The deposition and subsequent recess result in full height vertical dielectric layers 2702, 2704. Materials of full height vertical dielectric layers 2702, 2704 may include the material discussed for full height vertical dielectric layers 1202. The bottom surface of full height vertical dielectric layers 2702, 2704 abuts and/or is formed in part of the BOX $SiO_2$ layer 204.

Figure 28:
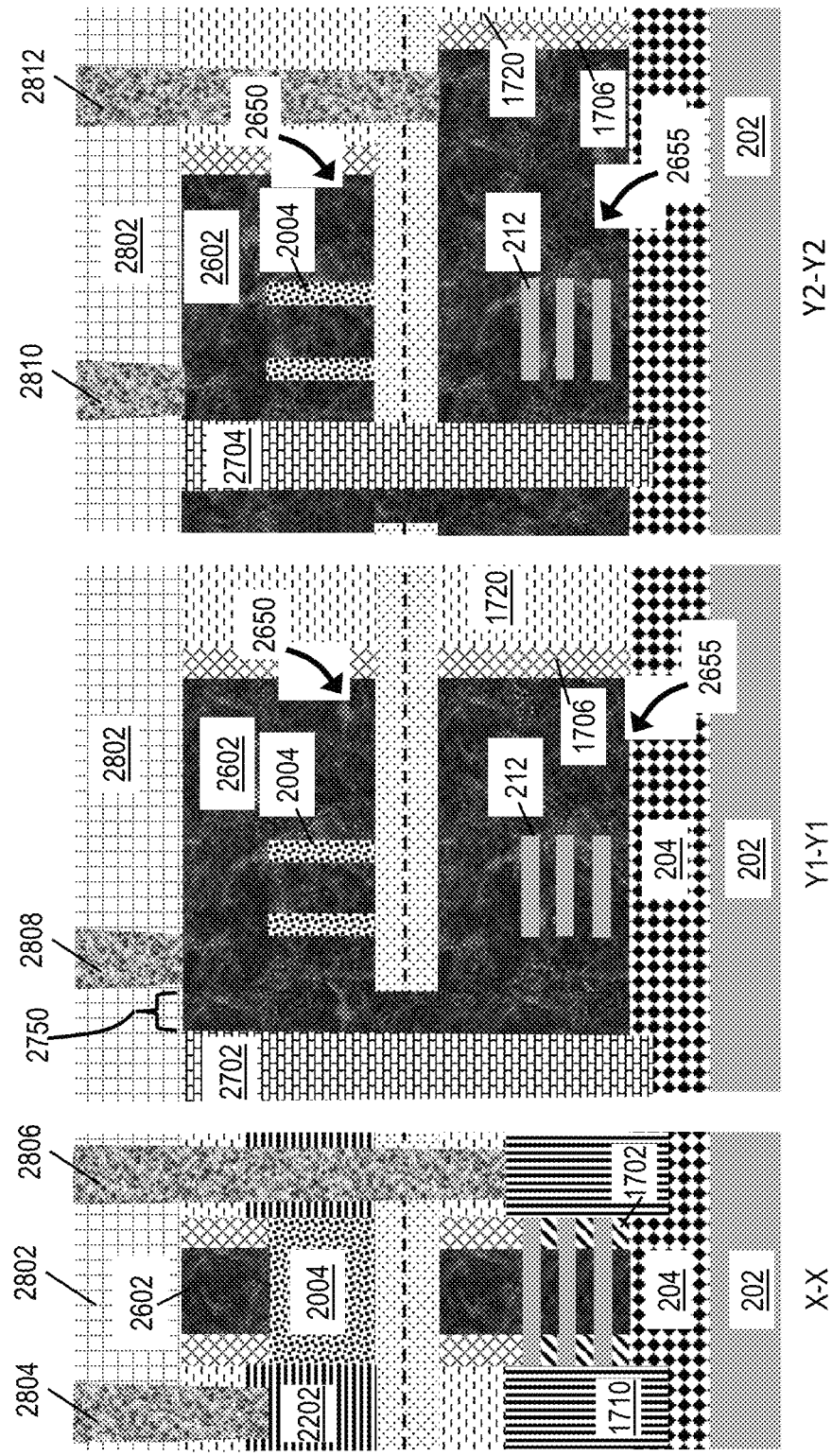
FIG. 28 depicts a cross-sectional view of a portion of an IC under-fabrication after fabrication operations according to one or more embodiments of the invention.

FIG. 28 depicts a cross-sectional view of a portion of the IC 1600 after fabrication operations according to one or more embodiments of the invention. FIG. 28 depicts the final structure after contact formation. Interlayer dielectric (ILD) material 2802 is deposited and patterned to form source/drain contact cavities (not shown) and gate contact cavities. Source/drain contacts 2804, 2806 are formed in source/drain contact cavities extending through ILD material 2802 to contact source/drain regions 2202, 1702, respectively. Gate contact cavities (not shown) are patterned in ILD material 2802 to expose gate material 2602, and gate contacts 2808, 2810, 2812 are formed in the respective gate cavities to contact the underlying gate material 2602. Again, it is noted that the X-X view can be applied to and represents a configuration for both the Y1-Y1 view and the Y2-Y2 view.

In the configuration for the Y1-Y1 view, gate contact 2808 is utilized to provide shared gate control for both the first FET device 2650 and second FET device 2655. Full height vertical dielectric layer 2702 is formed with the space/gap 2750 between bonding material layers 1902, 2002 so as not to separate/divide gate material 2602 such that electrical (and physical) connection of gate material 2602 is made between first FET device 2650 and second FET device 2655 in the Y1-Y1 view.

In the configuration for the Y2-Y2 view, gate contact 2810 and gate contact 2812 are independent, thereby providing independent gate control of first FET device 2650 and bottom FET device 2655, respectively. The combination of (middle/horizontal) bonding materials 1902, 2002 (i.e., dielectric isolation layer), and full height vertical dielectric layer 2704 is formed to both physically and electrically separate the gate material 2602 between first FET device 2650 and second FET device 2655. As seen in Y2-Y2 view of FIG. 28, gate contact 2810 is used to independently control the gate (i.e., top gate material 2602) of first FET device 2650, while gate contact 2812 is used to independently control the gate (i.e., bottom gate material 2602) of second FET device 2655.

Figure 29:
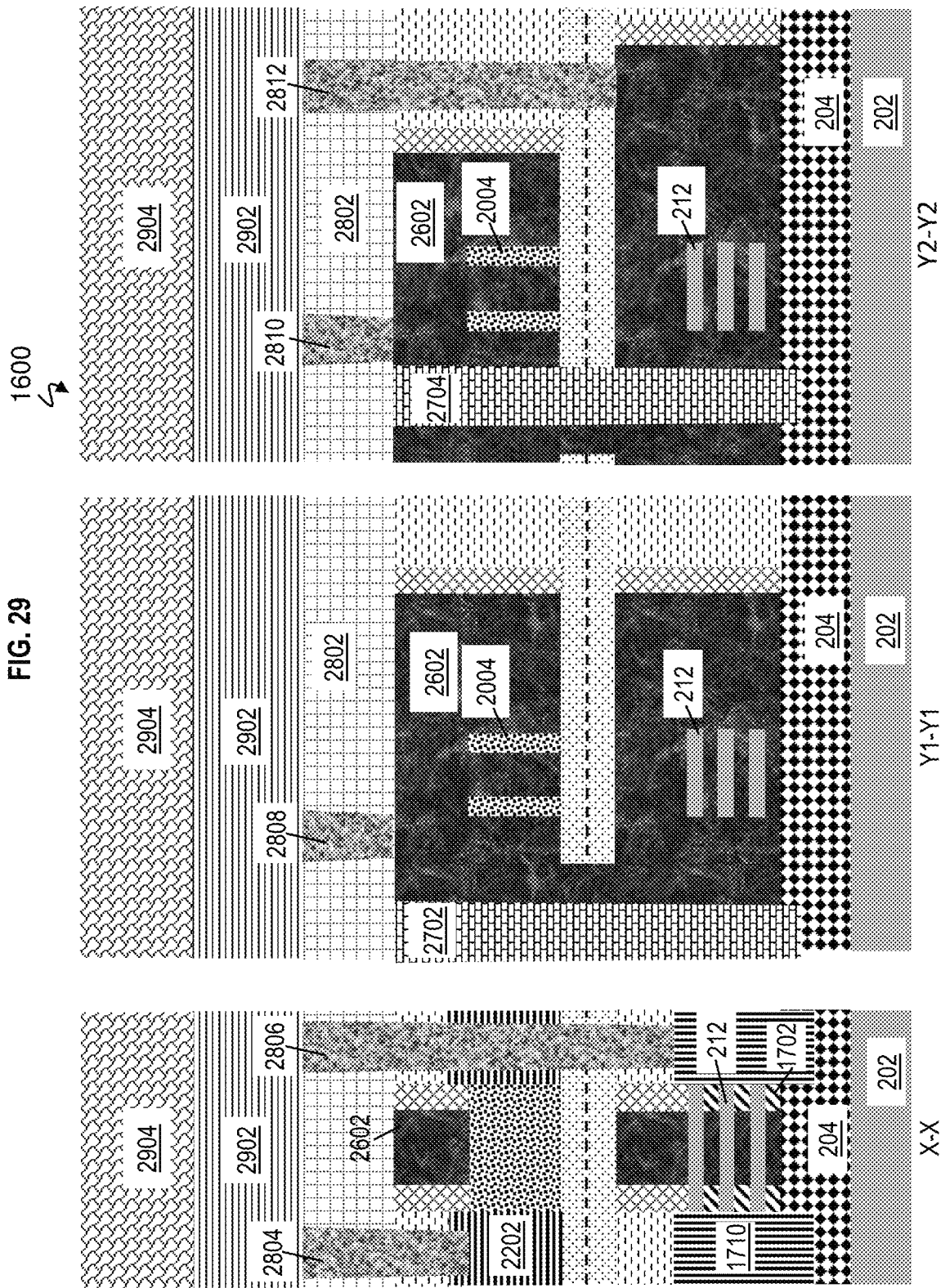
FIG. 29 depicts a cross-sectional view of a portion of an IC under-fabrication after fabrication operations according to one or more embodiments of the invention.

FIG. 29 depicts a cross-sectional view of a portion of the IC 1600 after fabrication operations according to one or more embodiments of the invention. A back-end-of-line (BEOL) interconnect layer 2902 is formed. BEOL interconnect layer 2902 includes individual connections (not shown) to various contacts as understood by one of ordinary skill in the art. BEOL interconnect 2902 includes one or more metal layers and vias in between different metal levels. A carrier wafer 2904 is bonded to BEOL interconnect layer 2902 through conventional dielectric bonding or Cu bonding process.

Figure 31:
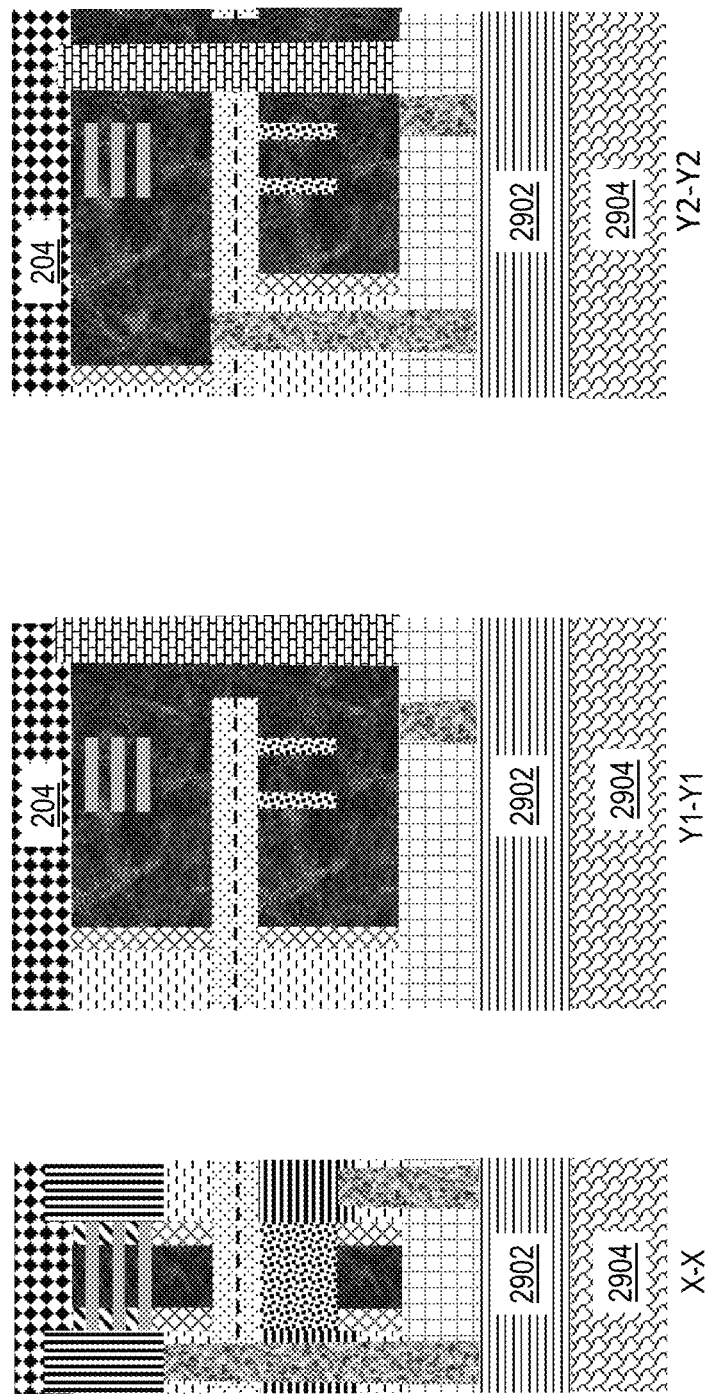
FIG. 31 depicts a cross-sectional view of a portion of an IC under-fabrication after fabrication operations according to one or more embodiments of the invention.

FIG. 30 depicts a cross-sectional view of a portion of the IC 1600 after fabrication operations according to one or more embodiments of the invention. FIG. 30 depicts that the wafer has been flipped in preparation for subsequent operations. FIG. 31 depicts a cross-sectional view of a portion of the IC 1600 after fabrication operations according to one or more embodiments of the invention. Selective substrate removal is performed to remove semiconductor layer 202 (depicted in FIG. 30). For example, wafer grinding is performed followed by planarization (e.g., CMP), followed by selective Si wet or dry etch process resulting in the removal of semiconductor layer 202, stopping on BOX $SiO_2$ layer 204.

Figure 32:
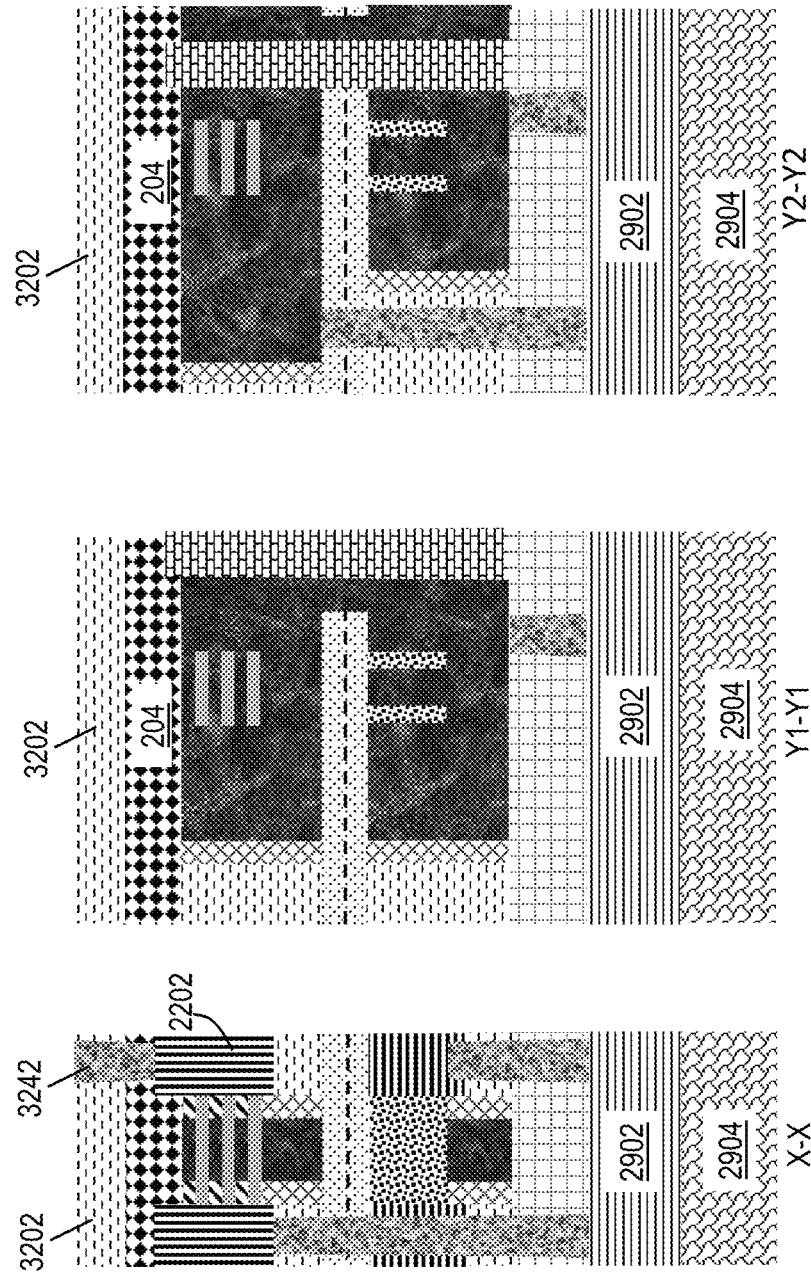
FIG. 32 depicts a cross-sectional view of a portion of an IC under-fabrication after fabrication operations according to one or more embodiments of the invention.

FIG. 32 depicts a cross-sectional view of a portion of the IC 1600 after fabrication operations according to one or more embodiments of the invention. FIG. 32 illustrates formation of backside source/drain contact 3242. Interlayer dielectric (ILD) material 3202 is optionally deposited and patterned to form a source/drain contact cavity (not shown). Backside source/drain contact 3242 is formed in the source/drain contact cavity extending through ILD material 3202 to contact one of the source/drain regions 2202. By having source/drawing regions 2202 taller than and/or extend beyond the edge of gate material 2602, this provides a better landing area for backside source/drain contact 3242.

FIG. 33 depicts a cross-sectional view of a portion of the IC 1600 after fabrication operations according to one or more embodiments of the invention. FIG. 33 illustrates forming backside power distribution network (BSPDN) layer 3302 on backside source/drain contact 3242 and ILD material 3202. BSPDN layer 3302 includes various interconnect wires for connecting to the transistors as understood by one of ordinary skill in the art.

A method of forming a complementary-FET device is provided according to one or more embodiments. The method includes providing vertically stacked transistors (e.g., as depicted in FIGS. 13, 15A, 27) comprising at least one first transistor (e.g., FET device 1350 in FIGS. 13, 15A, FET device 2650 in FIG. 27) and at least one second transistor (e.g., FET device 1355 in FIGS. 13, 15A, FET device 2655 in FIG. 27) separated by a dielectric isolation layer (e.g., dielectric isolation layer 402 in FIGS. 13, 15A, the combination of bonding material layers 1902, 2002 in FIG. 27). The method includes providing gate material (e.g., gate material 1302 in FIGS. 13, 15A, gate material 2602 in FIG. 27) adjacent to the at least one first transistor and the at least one second transistor, at least one first height vertical layer (e.g., full height vertical dielectric layers 1202 in FIGS. 13, 15A, full height vertical dielectric layers 2702, 2704 in FIG. 27) being adjacent to and about a height of the gate material (e.g., gate material 1302 in FIGS. 13, 15A, gate material 2602 in FIG. 27), at least one second height vertical layer (e.g., top vertical dielectric layer 1204 in FIGS. 13, 15A, sidewall spacers 1706, 2206 in FIG. 27) being adjacent to and less than the height of the gate material.

Further, the at least one second height vertical layer abuts the dielectric isolation layer (e.g., top vertical dielectric layer 1204 abuts dielectric isolation layer 402 in FIGS. 13, 15A, sidewall spacers 1706, 2206 abut the combination of bonding material layers 1902, 2002 in FIG. 27). The at least one second height vertical layer is adjacent to the dielectric isolation layer so as to electrically isolate the at least one first transistor from the at least one second transistor, as depicted in FIGS. 13, 15A and the Y2-Y2 view in FIG. 27. The at least one second height vertical layer is about half the height of the gate material (e.g., top vertical dielectric layer 1204 is about half (a little more and/or a little less than half) the height of gate material 1302 in FIGS. 13, 15A, sidewall spacers 1706, 2206 is about half (or a little less than half) the height of gate material 2602 in FIG. 27).

Additionally, one end of the dielectric isolation layer is adjacent to the at least one second height vertical layer and another end is adjacent to another vertical layer (e.g., lower spacer 702 in FIGS. 13, 15A), the another vertical layer being adjacent to the gate material. An arrangement of the at least one first height vertical layer and the dielectric isolation layer provides independent control of the gate material for the at least one first transistor and the at least one second transistor, as depicted in FIGS. 13, 15A and Y2-Y2 view in FIG. 27. An arrangement of the at least one first height vertical layer and the dielectric isolation layer provides shared control of the gate material for the at least one first transistor and the at least one second transistor, as depicted in Y1-Y1 view in FIG. 27.

A method of forming complementary-FET devices is provided according to one or more embodiments. The method includes an independent gate device (e.g., in FIGS. 13, 15A, in Y2-Y2 view of FIG. 27) comprising first vertically stacked transistors (e.g., FET devices 1350, 1355 in FIG. 13, 15A, FET devices 2650, 2655 in Y2-Y2 view of FIG. 27) and a first center dielectric layer connecting one first vertical layer to another first vertical layer (e.g., dielectric isolation layer 402 connects top vertical dielectric layer 1204 and lower spacer 702 in FIGS. 13, 15A), the first center dielectric layer separating first transistors in the first vertically stacked transistors. The method includes providing a shared gate device (e.g., in FIG. 15B, Y1-Y1 view in FIG. 27) comprising second vertically stacked transistors (e.g., FET devices 1350, 1355 in FIG. 15B, FET devices 2650, 2655 in Y1-Y1 view of FIG. 27) and a second center dielectric layer (e.g., dielectric isolation layer 402 in FIG. 15B, in the combination of bonding material layers 1902, 2002 in Y1-Y1 view of FIG. 27) separating second transistors of the second vertically stacked transistors.

Further, the independent gate device and the shared gate device coexist on a wafer, as depicted in any combination complementary-FET devices in FIGS. 13, 15A, 15B, FIG. 27 as well as any figures discussed herein. The independent gate device comprises nanosheets, a width of the first center dielectric layer being greater than a width of the nanosheets; for example, the width of dielectric isolation layer 402 is greater than the width of semiconductor material layers 212 in FET device 1350 in FIGS. 13, 15A, greater than the width of semiconductor material layers 212 in FET device 2655 of FIG. 27. The shared gate device comprises nanosheets, a width of the second center dielectric layer being greater than a width of the nanosheets; for example, the width of dielectric isolation layer 402 is greater than the width of semiconductor material layers 212 in FET device 1355 in FIGS. 13, 15A, greater than the width of semiconductor material layers 212 in FET device 2655 of FIG. 27.

Additionally, the independent gate device and the shared gate device comprise gate material and are both bounded by full height vertical layers (e.g., full height vertical dielectric layers 1202 in FIGS. 13, 15A, 15B), the full height vertical layers being adjacent to and about a height of the gate material (e.g., gate material 1302, 2602). At least one side of the first center dielectric layer (e.g., dielectric isolation layer 402) does not touch any one of the full height vertical layers (e.g., full height vertical dielectric layers 1202 in FIG. 13, 15B). At least one side of the second center dielectric layer does not touch any one of the full height vertical layers, as depicted in FIGS. 13, 15B.

A method of forming complementary-FET devices is provided according to one or more embodiments. The method includes providing an independent gate device (e.g., Y2-Y2 view in FIG. 27) comprising first vertically stacked transistors and a first center dielectric layer (e.g., combined bonding material layers 1902, 2002) connected to a first vertical layer (e.g., full height vertical dielectric layer 2704 in Y2-Y2 view in FIG. 27). The method includes providing a shared gate device (e.g., Y1-Y1 view in FIG. 27) comprising second vertically stacked transistors and a second center dielectric layer(e.g., combined bonding material layers 1902, 2002 in Y1-Y2 view in FIG. 27), shared gate material (e.g., gate material 2602) being present at a space/gap 2750 between the second center dielectric layer (e.g., combined bonding material layers 1902, 2002 in Y1-Y1 view in FIG. 27) and a second vertical layer (e.g., full height vertical dielectric layer 2702 in Y1-Y1 view in FIG. 27).

Further, the first vertically stacked transistors comprise gate material 2602 adjacent to the first center dielectric layer (e.g., combined bonding material layers 1902, 2002 in Y2-Y2 view in FIG. 27). The first center dielectric layer (e.g., combined bonding material layers 1902, 2002 in Y2-Y2 view in FIG. 27) is connected to the first vertical layer (e.g., full height vertical dielectric layer 2704 in Y2-Y2 view in FIG. 27) so as to allow no space in between for gate material 2602.

Additionally, other first vertical layers (e.g., sidewall spacers 1706, 2206) abut the first center dielectric layer (e.g., combined bonding material layers 1902, 2002 in Y2-Y2 view in FIG. 27) on a distal end from the first vertical layer (e.g., full height vertical dielectric layer 2704 in Y2-Y2 view in FIG. 27). The shared gate material (e.g., gate material 2602) vertically extends about a height of the second vertical layer (e.g., full height vertical dielectric layer 2702 in Y1-Y1 view in FIG. 27). Other second vertical layers (e.g., sidewall spacers 1706, 2206) abut the second center dielectric layer (e.g., combined bonding material layers 1902, 2002 in Y1-Y1 view in FIG. 27) on a distal end away from the second vertical layer (e.g., full height vertical dielectric layer 2702 in Y1-Y1 view in FIG. 27).

Figure 34:
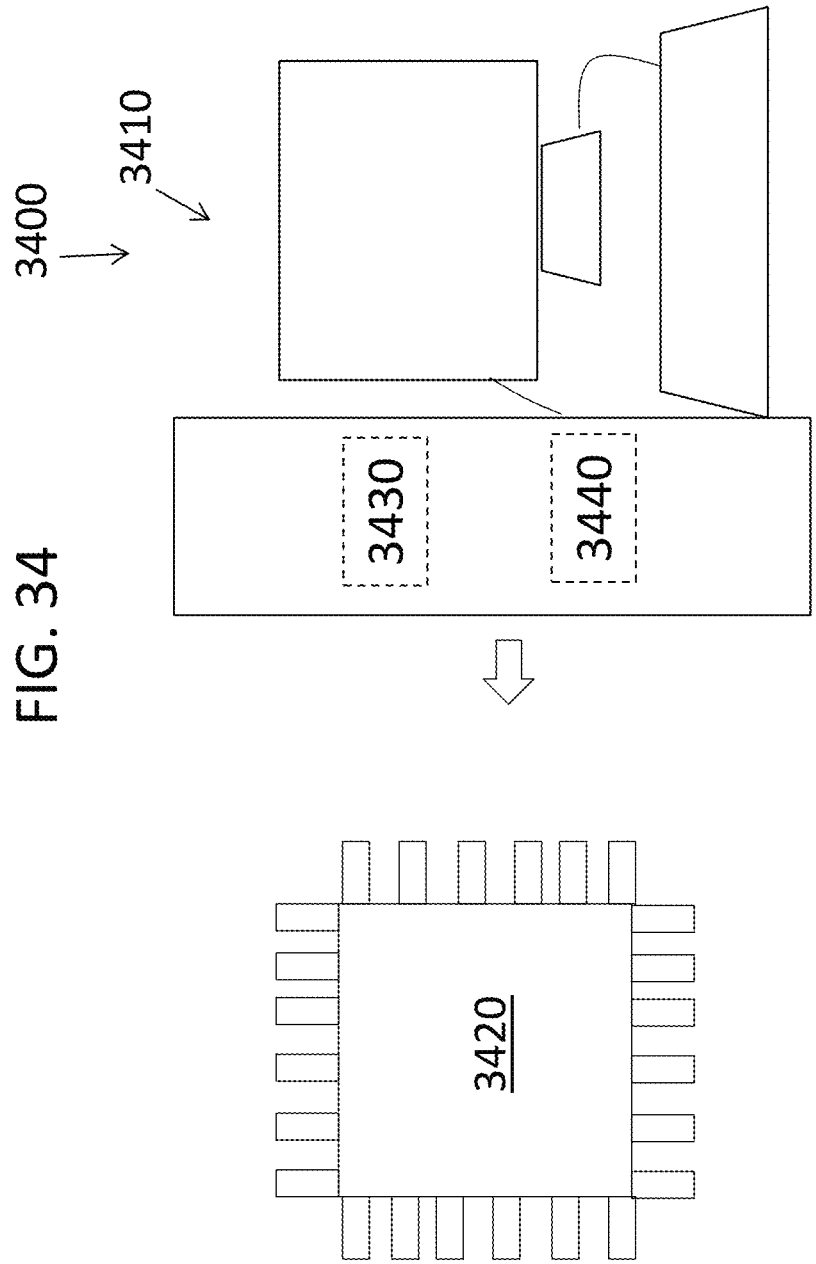
FIG. 34 is a block diagram of a system to design/layout a portion of an IC using gate cut and separation techniques for stacked FET technology in accordance with one or more embodiments of the present invention.

FIG. 34 is a block diagram of a system 3400 according to embodiments of the invention. The system 3400 includes processing circuitry 3410 used to generate the design 3430 that is ultimately fabricated into an integrated circuit 3420, which can include a variety of active semiconductor devices (e.g., FET devices 1350, 1355, 2650, 2655). The steps involved in the fabrication of the integrated circuit 3420 are well-known and briefly described herein. Once the physical layout 3440 is finalized, based, in part, on ICs 100, 100 having stacked FET devices according to embodiments of the invention, the finalized physical layout 3440 is provided to a foundry. Masks are generated for each layer of the integrated circuit based on the finalized physical layout. Then, the wafer is processed in the sequence of the mask order. The processing includes photolithography and etch. This is further discussed with reference to FIG. 35.

Figure 35:
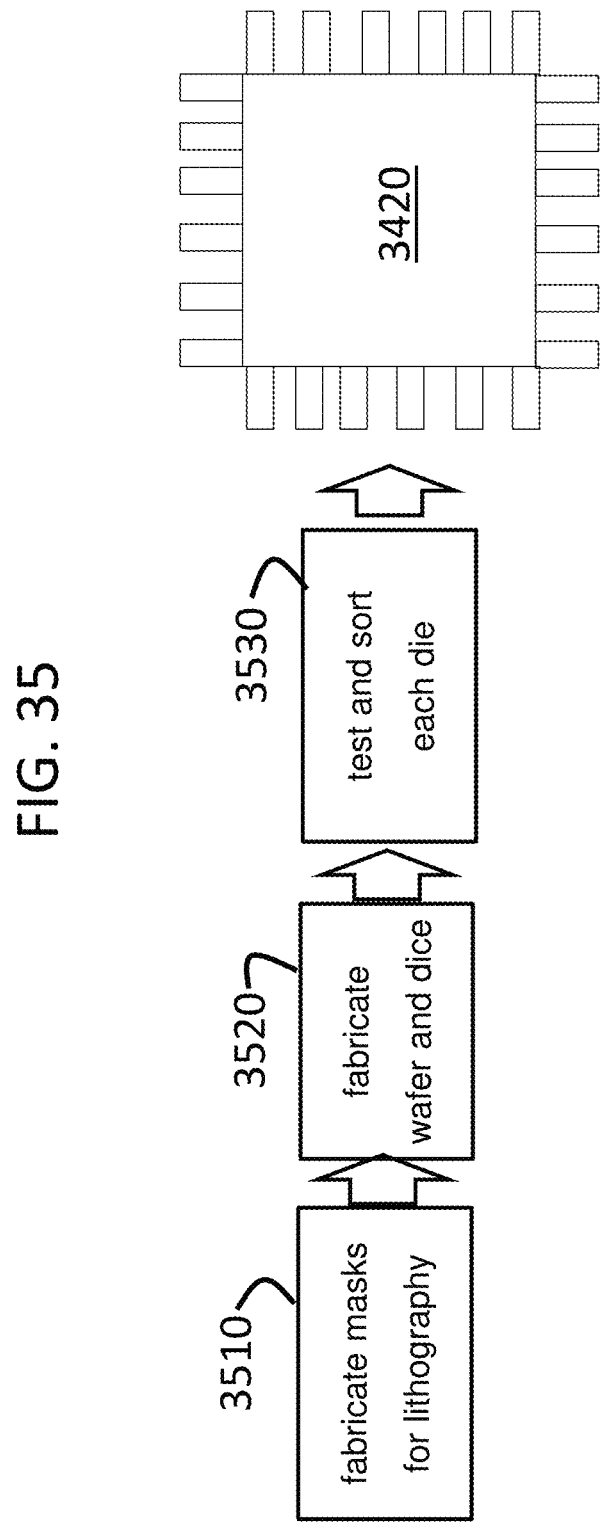
FIG. 35 is a process flow of a method of fabricating the IC of FIG. 34 in accordance with one or more embodiments of the present invention.

FIG. 35 is a process flow of a method of fabricating the integrated circuit according to exemplary embodiments of the invention. Once the physical design data is obtained, based, in part, ICs 100, 1600 for vertical field effect transistors having different threshold voltages along the vertical channel, the integrated circuit 3420 can be fabricated according to known processes that are generally described with reference to FIG. 35. Generally, a wafer with multiple copies of the final design is fabricated and cut (i.e., diced) such that each die is one copy of the integrated circuit 3420. At block 3510, the processes include fabricating masks for lithography based on the finalized physical layout. At block 3520, fabricating the wafer includes using the masks to perform photolithography and etching. Once the wafer is diced, testing and sorting each die is performed, at block 3530, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants.

Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising:
vertically stacked transistors comprising at least one first transistor and at least one second transistor separated by a dielectric isolation layer; and
gate material adjacent to the at least one first transistor and the at least one second transistor, at least one first height vertical layer being adjacent to and about a height of the gate material, at least one second height vertical layer being adjacent to and less than the height of the gate material, the gate material being positioned on an underlayer;
wherein one end of the dielectric isolation layer is adjacent to the at least one second height vertical layer and another end is adjacent to another vertical layer, the another vertical layer comprising a top surface and a bottom surface;
wherein the top surface of the another vertical layer abuts a conductive portion of the gate material and the bottom surface abuts the underlayer.

2. The device of claim 1, wherein the at least one second height vertical layer abuts the dielectric isolation layer.

3. The device of claim 1, wherein the at least one second height vertical layer is adjacent to the dielectric isolation layer so as to electrically isolate the at least one first transistor from the at least one second transistor.

4. The device of claim 1, wherein the at least one second height vertical layer is about half the height of the gate material.

5. The device of claim 1, wherein an arrangement of the at least one first height vertical layer and the dielectric isolation layer provides independent control of the gate material for the at least one first transistor and the at least one second transistor.

6. The device of claim 1, wherein an arrangement of the at least one first height vertical layer and the dielectric isolation layer provides shared control of the gate material for the at least one first transistor and the at least one second transistor.

* * * * *